(12) United States Patent
Toyota et al.

(10) Patent No.: US 8,309,960 B2
(45) Date of Patent: Nov. 13, 2012

(54) DISPLAY DEVICE

(75) Inventors: Yoshiaki Toyota, Koshigaya (JP); Mieko Matsumura, Kokubunji (JP); Masatoshi Wakagi, Hitachinaka (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 248 days.

(21) Appl. No.: 12/702,900

(22) Filed: Feb. 9, 2010

(65) Prior Publication Data

US 2010/0200858 A1 Aug. 12, 2010

(30) Foreign Application Priority Data

Feb. 9, 2009 (JP) ................................. 2009-027189
Apr. 27, 2009 (JP) ................................. 2009-107252

(51) Int. Cl.
*H01L 29/04* (2006.01)
*H01L 31/036* (2006.01)
*H01L 31/0376* (2006.01)
*H01L 31/20* (2006.01)

(52) U.S. Cl. ................................ 257/59; 257/61; 257/72

(58) Field of Classification Search .............. 257/61
See application file for complete search history.

(56) References Cited

U.S. PATENT DOCUMENTS

| | | | |
|---|---|---|---|
| 5,474,941 A | 12/1995 | Mitani et al. |
| 6,265,249 B1 | 7/2001 | Wu |
| 6,444,505 B1 | 9/2002 | Chen et al. |
| 2004/0113214 A1 | 6/2004 | Takenaka |
| 2009/0057682 A1 | 3/2009 | Tsubata et al. |

FOREIGN PATENT DOCUMENTS

| | | |
|---|---|---|
| EP | 0 411 726 | 2/1991 |
| EP | 1 981 086 | 10/2008 |
| JP | 1-300567 | 12/1989 |
| JP | 1-3000567 | 12/1989 |
| JP | 05-013439 | 1/1993 |
| JP | 11-186558 | 7/1999 |
| JP | 2004-193248 | 7/2004 |
| KR | 10-2007-0071412 | 7/2007 |

(Continued)

OTHER PUBLICATIONS

Matsumoto et al, "5 & 10 diagonal color AM-LCDs addressed by a-Si TFTs using precisely controlled fabrication processes", Oct. 4, 1988 (1988 International Display Research Conference), pp. 65-69.

(Continued)

*Primary Examiner* — Thien F Tran
(74) *Attorney, Agent, or Firm* — Antonelli, Terry, Stout & Kraus, LLP.

(57) ABSTRACT

A display device includes a plurality of thin-film transistors formed on a substrate on which a display area is formed. At least one of the plurality of thin-film transistors includes a gate electrode, agate insulating film formed to cover the gate electrode, an interlayer insulating film formed on an upper surface of the gate insulating film and having an opening formed in an area where the gate electrode is formed in plan view, a pair of heavily-doped semiconductor films arranged on an upper surface of the interlayer insulating film with the opening interposed therebetween, a polycrystalline semiconductor film formed across the opening and formed in the area, the polycrystalline semiconductor film being electrically connected to the pair of heavily-doped semiconductor films, and a pair of electrodes formed to overlap the pair of heavily-doped semiconductor films, respectively, without overlapping the polycrystalline semiconductor film.

14 Claims, 27 Drawing Sheets

FOREIGN PATENT DOCUMENTS

WO    WO 2007/097074    8/2007

OTHER PUBLICATIONS

Tanaka et al, "An LCD addressed by a-Si:H TFTs with peripheral poly-Si TFT circuits", Electron Devices Meeting, 1993. Technical Digest., International Washington DC, UDA, Dec. 5-8, 1993; Dec. 5, 1993, pp. 389-392.

Takashi Aoyama et al, "Inverse Staggered Poly-Si and Amorphous Si Double Structure TFTs for LCD Panels with Peripheral Driver Circuits Integration", IEEE Transactions on Electron Devices, IEEE Service Center, Pisacataway, NJ, US, vol. 43, No. 5, May 1, 1996.

Yuki M et al, "A full color LCD addressed by poly Si TFTs fabricated at low temperature below 450 degrees C", Oct. 4, 1988, pp. 220-221.

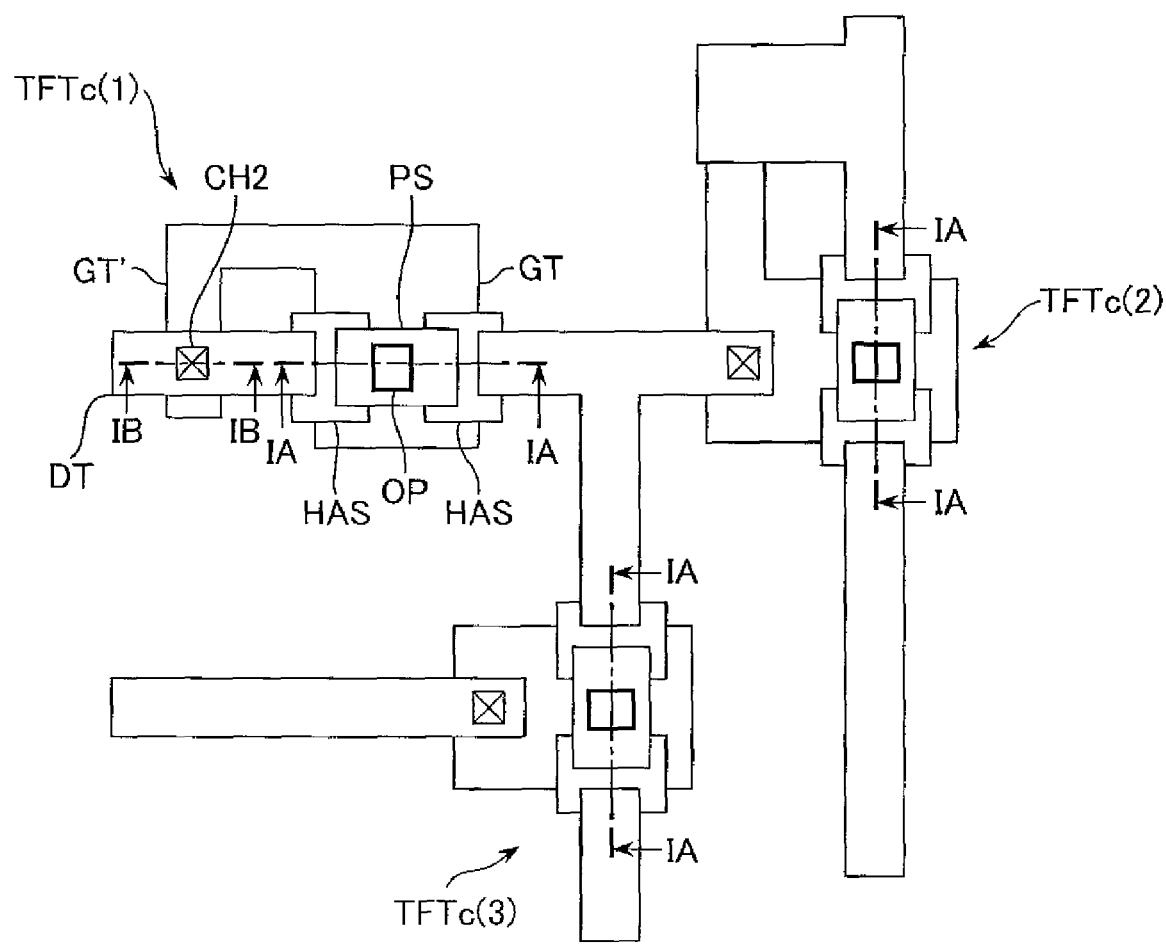

DISPLAY DEVICE

CROSS-REFERENCE TO RELATED APPLICATION

The present application claims priority from Japanese Applications JP2009-027189 filed on Feb. 9, 2009 and JP2009-107252 filed on Apr. 27, 2009, the contents of which are hereby incorporated by reference into this application.

BACKGROUND OF THE INVENTION

1. Field of the Invention

The present invention relates to a display device, in particular, a display device including a plurality of thin-film transistors formed on a substrate on which a display area is formed.

2. Description of the Related Art

A display device includes a large number of pixels formed in its display area and arranged in matrix. The pixels are normally driven by a so-called active matrix method.

That is, pixel groups each including a plurality of pixels arranged in a row direction are sequentially selected, and when a group of pixels are selected, a video signal is fed to the selected group of pixels via a drain signal line connected commonly to pixels arranged in a column direction. In this case, each group of pixels is selected by turning on thin-film transistors, which are respectively formed in the pixels constituting the group of pixels, with a scanning signal fed to the thin-film transistors via a gate signal line that is connected commonly to the thin-film transistors.

A typical one of such display devices includes a drain driver that feeds a video signal to each drain signal line, and a gate driver that feeds a scanning signal to each gate signal line. The drivers are formed on a substrate and in a periphery of a display area formed on the substrate. Each driver includes a large number of thin-film transistors formed in parallel with the thin-film transistors formed in the pixels.

A so-called bottom-gate type thin-film transistor is known as an example of such thin-film transistors. In the bottom-gate type thin-film transistor, an interlayer insulating film with an opening is formed on an upper surface of a gate insulating film, and a polysilicon layer is formed to cover the opening (see Japanese Patent Application Laid-open No. 2004-193248 and Japanese Patent Application Laid-open No. Hei 11-186558). In the thin-film transistor configured accordingly, a portion of the polysilicon layer that is formed at the bottom of the opening functions as a channel area, and a portion of the polysilicon layer that is formed on the side wall surface of the opening serves as an offset area. Therefore, the electric field at the end of the drain may be limited to reduce an off current.

The details of the structure of the thin-film transistor disclosed in Japanese Patent Application Laid-open No. 2004-193248 are as follows. An interlayer insulating film is formed on the upper surface of a gate insulating film, under which a gate electrode is formed. The interlayer insulating film has an opening generally at the center of an area overlapping the gate electrode in plan view. A drain electrode and a source electrode are formed on the upper surface of the interlayer insulating film with the opening interposed therebetween. Each of the drain electrode and the source electrode is formed of a laminate obtained by sequentially laminating a heavily-doped amorphous silicon layer and a metal layer. A polysilicon layer is formed to cover the opening of the interlayer insulating film such that a peripheral portion of the polysilicon layer overlaps a part of each of the drain electrode and the source electrode.

The details of the structure of the thin-film transistor disclosed in Japanese Patent Application Laid-open No. Hei 11-186558 are as follows. An interlayer insulating film is formed on the upper surface of a gate insulating film, under which a gate electrode is formed. The interlayer insulating film has an opening in an area overlapping the gate electrode in plan view. A polysilicon layer is formed to cover the opening of the interlayer insulating film. The polysilicon layer has a drain area and a source area formed on the upper surface of the interlayer insulating film. The drain area and the source area are formed by ion implantation of high-concentration impurities into the semiconductor film. A source electrode is formed between the gate insulating film and the interlayer insulating film. The source electrode and the source area of the polysilicon layer are connected through a contact hole formed in the interlayer insulating film.

SUMMARY OF THE INVENTION

In the thin-film transistor disclosed in Japanese Patent Application Laid-open No. 2004-193248, however, each of the drain electrode and the source electrode directly contacts the polysilicon layer, which disadvantageously increases a so-called off-leak current at the contact areas.

In order to secure a large contact area between the polysilicon layer and the heavily-doped amorphous silicon layer, it is necessary to increase the side-etching amounts of the drain electrode and the source electrode in the formation of the drain electrode and the source electrode. Therefore, it is necessary to secure large layout spaces for the drain electrode and the source electrode, which disadvantageously hinders circuit integration.

In the thin-film transistor disclosed in Japanese Patent Application Laid-open No. Hei 11-186558, implantation of impurities is required to form the highly-doped polysilicon layer, which disadvantageously increases the number of manufacturing processes.

An object of the present invention is to provide a display device including thin-film transistors each having a reduced off current and a reduced off-leak current and enabling circuit integration without increasing the number of manufacturing processes.

The present invention is configured, for example, as follows.

(1) A display device according to the present invention includes a plurality of thin-film transistors formed on a substrate on which a display area is formed. At least one of the plurality of thin-film transistors includes a gate electrode, a gate insulating film formed to cover the gate electrode, an interlayer insulating film formed on an upper surface of the gate insulating film and having an opening formed in an area where the gate electrode is formed in plan view, a pair of heavily-doped amorphous semiconductor films arranged on an upper surface of the interlayer insulating film with the opening interposed therebetween, a polycrystalline semiconductor film formed across the opening of the interlayer insulating film and formed in the area where the gate electrode is formed in plan view, the polycrystalline semiconductor film being electrically connected to the pair of heavily-doped amorphous semiconductor films, and a pair of electrodes formed to overlap the pair of heavily-doped amorphous semiconductor films, respectively, without overlapping the polycrystalline semiconductor film.

(2) In the display device of the present invention according to Item (1), each of the pair of heavily-doped amorphous semiconductor films and the polycrystalline semiconductor film are electrically connected by overlapping a part of each of the pair of heavily-doped amorphous semiconductor films and the polycrystalline semiconductor film.

(3) In the display device of the present invention according to Item (2), the pair of heavily-doped amorphous semiconductor films are thicker at a portion overlapping the polycrystalline semiconductor film than a portion not overlapping the polycrystalline semiconductor film.

(4) In the display device of the present invention according to Item (1), each of the pair of heavily-doped amorphous semiconductor films and the polycrystalline semiconductor film are electrically connected by contacting a side wall surface of each of the pair of heavily-doped amorphous semiconductor films with a side wall surface of the polycrystalline semiconductor film.

(5) In the display device of the present invention according to Item (4), each of the pair of heavily-doped amorphous semiconductor films is thicker than the polycrystalline semiconductor film formed to cover the opening of the interlayer insulating film.

(6) In the display device of the present invention according to Item (1), in at least one of the plurality of thin-film transistors, one of the pair of electrodes is electrically connected to the gate electrode through a through hole formed in the interlayer insulating film and the gate insulating film.

(7) In the display device of the present invention according to Item (1), the opening of the interlayer insulating film is exposed from each side of the polycrystalline semiconductor film in a channel length direction in plan view.

(8) A display device according to the present invention includes a plurality of thin-film transistors formed on a substrate on which a display area is formed. At least one of the plurality of thin-film transistors includes a gate electrode, an interlayer insulating film formed on the gate electrode and having an opening formed in an area where the gate electrode is formed in plan view, and an island-like laminate formed by sequentially laminating a gate insulating film and a polycrystalline semiconductor film. The island-like laminate is formed across the opening of the interlayer insulating film and formed in the area where the gate electrode is formed in plan view. The at least one of the plurality of thin-film transistors also includes a pair of electrodes arranged on an upper surface of the interlayer insulating film with the opening interposed therebetween. Each of the pair of electrodes is formed of a laminate obtained by sequentially laminating a heavily-doped amorphous semiconductor film and a metal film and is formed to partly overlap the polycrystalline semiconductor film.

(9) In the display device of the present invention according to Item (8), one of the pair of electrodes is electrically connected to the gate electrode through a through hole formed in the interlayer insulating film.

(10) In the display device of the present invention according to Item (8), the opening of the interlayer insulating film is exposed from each side of the laminate obtained by sequentially laminating the gate insulating film and the polycrystalline semiconductor film in a channel length direction in plan view.

(11) A display device according to the present invention includes a plurality of thin-film transistors formed on a substrate on which a display area is formed. At least one of the plurality of thin-film transistors includes a gate electrode, an interlayer insulating film formed on the gate electrode and having an opening formed in an area where the gate electrode is formed in plan view, and an island-like laminate formed by sequentially laminating a gate insulating film, a polycrystalline semiconductor film, and an amorphous semiconductor film. The island-like laminate is formed across the opening of the interlayer insulating film and is formed in the area where the gate electrode is formed in plan view. The at least one of the plurality of thin-film transistors also includes a pair of electrodes arranged on an upper surface of the interlayer insulating film with the opening interposed therebetween. Each of the pair of electrodes is formed of a laminate obtained by sequentially laminating a heavily-doped amorphous semiconductor film and a metal film and is formed to partly overlap the amorphous semiconductor film.

(12) In the display device of the present invention according to Item (11), in the at least one of the plurality of thin-film transistors, one of the pair of electrodes thereof is electrically connected to the gate electrode through a through hole formed in the interlayer insulating film.

(13) In the display device of the present invention according to Item (11), the opening of the interlayer insulating film is exposed from each side of the laminate obtained by sequentially laminating the gate insulating film, the polycrystalline semiconductor film, and the amorphous semiconductor film in a channel length direction in plan view.

(14) A display device according to the present invention includes a plurality of thin-film transistors formed on a substrate on which a display area is formed. At least one of the plurality of thin-film transistors includes a gate electrode, an interlayer insulating film formed on the gate electrode and having an opening formed in an area where the gate electrode is formed in plan view, and an island-like laminate formed by sequentially laminating a gate insulating film, a polycrystalline semiconductor film, and an inorganic insulating film. The island-like laminate is formed so as to be across the opening of the interlayer insulating film and is formed in the area where the gate electrode is formed in plan view. The at least one of the plurality of thin-film transistors also includes a pair of electrodes arranged on an upper surface of the interlayer insulating film with the opening interposed therebetween. The gate insulating film and the polycrystalline semiconductor film is formed to protrude from the inorganic insulating film in plan view. Each of the pair of electrodes is formed of a laminate obtained by sequentially laminating a heavily-doped amorphous semiconductor film and a metal film and is formed so that respective opposing ends of the pair of electrodes overlap the polycrystalline semiconductor film and the inorganic insulating film.

(15) In the display device according to Item (14), in the at least one of the thin-film transistors, one of the pair of electrodes thereof is electrically connected to the gate electrode through a through hole formed in the interlayer insulating film.

(16) In the display device according to Item (14), the opening of the interlayer insulating film is exposed from each side of the laminate obtained by sequentially laminating the gate insulating film, the polycrystalline semiconductor film, and the amorphous semiconductor film in a channel length direction in plan view.

(17) A display device according to the present invention includes a plurality of thin-film transistors formed on a substrate on which a display area is formed. At least one of the plurality of thin-film transistors includes a gate electrode, an interlayer insulating film formed on the gate electrode and having an opening formed in an area where the gate electrode is formed in plan view, a gate insulating film formed to cover the interlayer insulating film, and an island-like laminate formed by sequentially laminating a semiconductor film and a heavily-doped semiconductor film. The island-like laminate is formed across the opening of the interlayer insulating film and is formed in the area where the gate electrode is formed in plan view. The at least one of plurality of thin-film transistors also includes a pair of electrodes arranged on an upper surface of the interlayer insulating film with the opening interposed therebetween. Each of the pair of electrodes being formed to partly overlap the heavily-doped semiconductor film.

(18) In the display device according to Item (17), in the at least one of the plurality of thin-film transistors, the gate insulating film is processed to have an island shape in the area where the gate electrode is formed. One of the pair of electrodes is electrically connected to the gate electrode through a through hole formed in the interlayer insulating film.

(19) In the display device according to Item (17), the opening of the interlayer insulating film is exposed from each side of the semiconductor film in a channel length direction in plan view.

(20) In the display device according to Item (17), the at least one of the pair of electrodes is formed inside the opening as well, and side surface portions of the island-like semiconductor film and the pair of electrodes contact each other on the upper surface of the interlayer insulating film.

Note that, the above-mentioned structure is merely illustrative, and the present invention may be appropriately changed without departing from the technical idea of the present invention. Moreover, examples of the structure of the present invention other than that described above are made apparent from the whole description of the specification or the accompanying drawings of the present application.

The display device configured as described above having at least one of thin-film transistors can have a reduced off current and a reduced off-leak current and realize circuit integration without increasing the number of manufacturing processes.

The other effects of the present invention are made apparent from the whole description of the specification.

BRIEF DESCRIPTION OF THE DRAWINGS

In the accompanying drawings:

FIG. 4 is a plan view of a bootstrap circuit illustrating the first embodiment of the display device according to the present invention;

DETAILED DESCRIPTION OF THE INVENTION

Embodiments of the present invention are described with reference to the drawings. The same or similar components are denoted by the same reference symbols in each of the drawings and each of the embodiments, and the overlapping description thereof is omitted.

First Embodiment

A first embodiment of a display device of the present invention is described taking a liquid crystal display device as an example.

(Equivalent Circuit)

Figure 2:
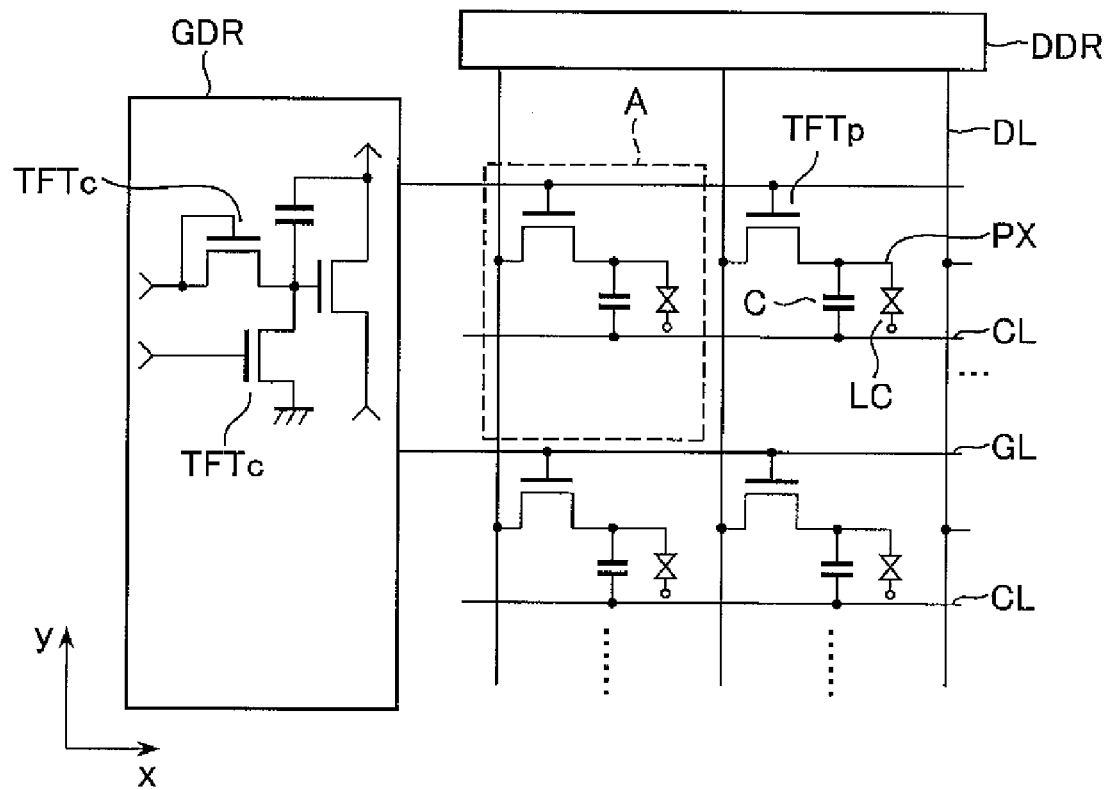
FIG. 2 is an equivalent circuit diagram of a display area illustrating the first embodiment of the display device according to the present invention.

FIG. 2 is a diagram illustrating an equivalent circuit of the liquid crystal display device according to the present invention. FIG. 2 illustrates a circuit formed on a surface of one substrate of a pair of substrates which are arranged to be opposed to each other with a liquid crystal being interposed therebetween, the surface being on the liquid crystal side. Even though FIG. 2 illustrates the equivalent circuit, the equivalent circuit is geometrically substantially similar to an actual circuit of the liquid crystal display device.

In FIG. 2, there are provided gate signal lines GL and drain signal lines DL. The gate signal lines GI, extend in an x-direction of FIG. 2 and are arranged in parallel to each other in a y-direction, whereas the drain signal lines DL extend in the y-direction of FIG. 2 and are arranged in parallel to each other in the x-direction. For example, a left end of each of the gate signal lines GL in FIG. 2 is connected to a gate driver GDR so that a scanning signal is fed by the gate driver GDR to each of the gate signal lines GL. For example, an upper end of each of the drain signal lines DL in FIG. 2 is connected to a drain driver DDR so that a video signal is fed by the drain driver DDR to each of the drain signal lines DL.

An area surrounded by a pair of the gate signal lines GL adjacent to each other and a pair of the drain signal lines DL adjacent to each other becomes a pixel area (area surrounded by the dot-lined frame A illustrated in FIG. 2). The pixel area is formed to include a thin-film transistor TFT (denoted by TFTp in FIG. 2), a pixel electrode PX, and a capacitor C. The thin-film transistor TFTp is turned ON by the scanning signal from the gate signal line. Through the thin-film transistor TFTp which is turned ON, the video signal from the drain signal line DL is fed to the pixel electrode PX. The capacitor C is formed between the pixel electrode PX and a common signal line CL. The common signal line CL is formed between the adjacent gate signal lines GL in parallel to the gate signal lines GL. The capacitor C is provided to store the video signal fed to the pixel electrode PX for a relatively long time. The pixel electrode PX generates an electric field between the pixel electrode PX and a counter electrode (not shown) that is formed on another substrate and is arranged to be opposed to the substrate, on which the pixel electrode PX is provided, via the liquid crystal LC. The generated electric field causes molecules of the liquid crystal LC in the pixel area to behave. The liquid crystal display device including the pixels as described above is called, for example, a longitudinal electric-field type liquid crystal display device. The present invention is also applicable to, for example, a so-called lateral electric-field type liquid crystal display device.

Here, the gate driver GDR is formed by, for example, a bootstrap circuit. The bootstrap circuit is formed by a plurality of the thin-film transistors TFT (denoted by TFTc in FIG. 2). The thin-film transistors TFTc are formed on the same substrate, on which the thin-film transistor TFTp formed in each of the pixels is formed, and are formed in parallel with the thin-film transistor TFTp when the thin-film transistor TFTp is formed.

(Pixel Structure)

Figures 1A, 1B:
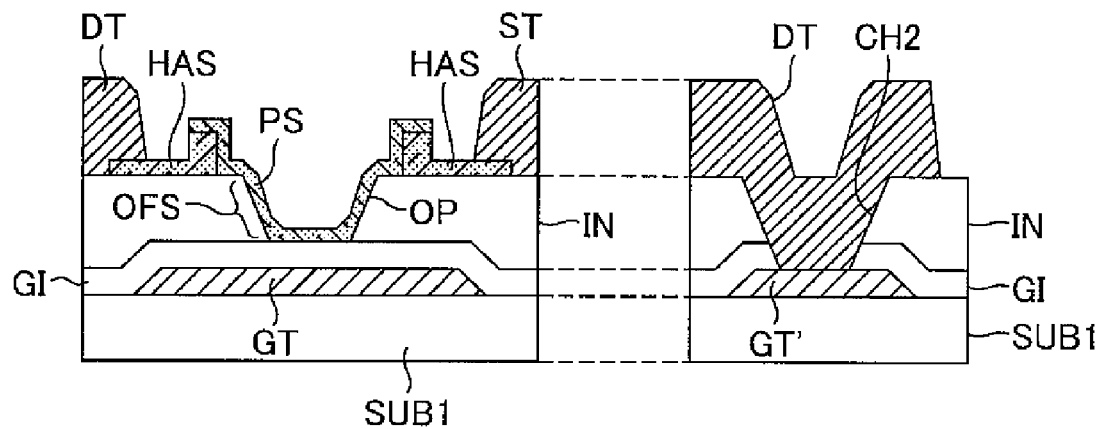
FIG. 1A is a view illustrating a structure of an essential portion of a first embodiment of a display device according to the present invention, and illustrates a thin-film transistor.
FIG. 1B is a diagram illustrating the structure of an essential portion of the first embodiment of the display device according to the present invention, and illustrates a thin-film transistor.
Figure 3:
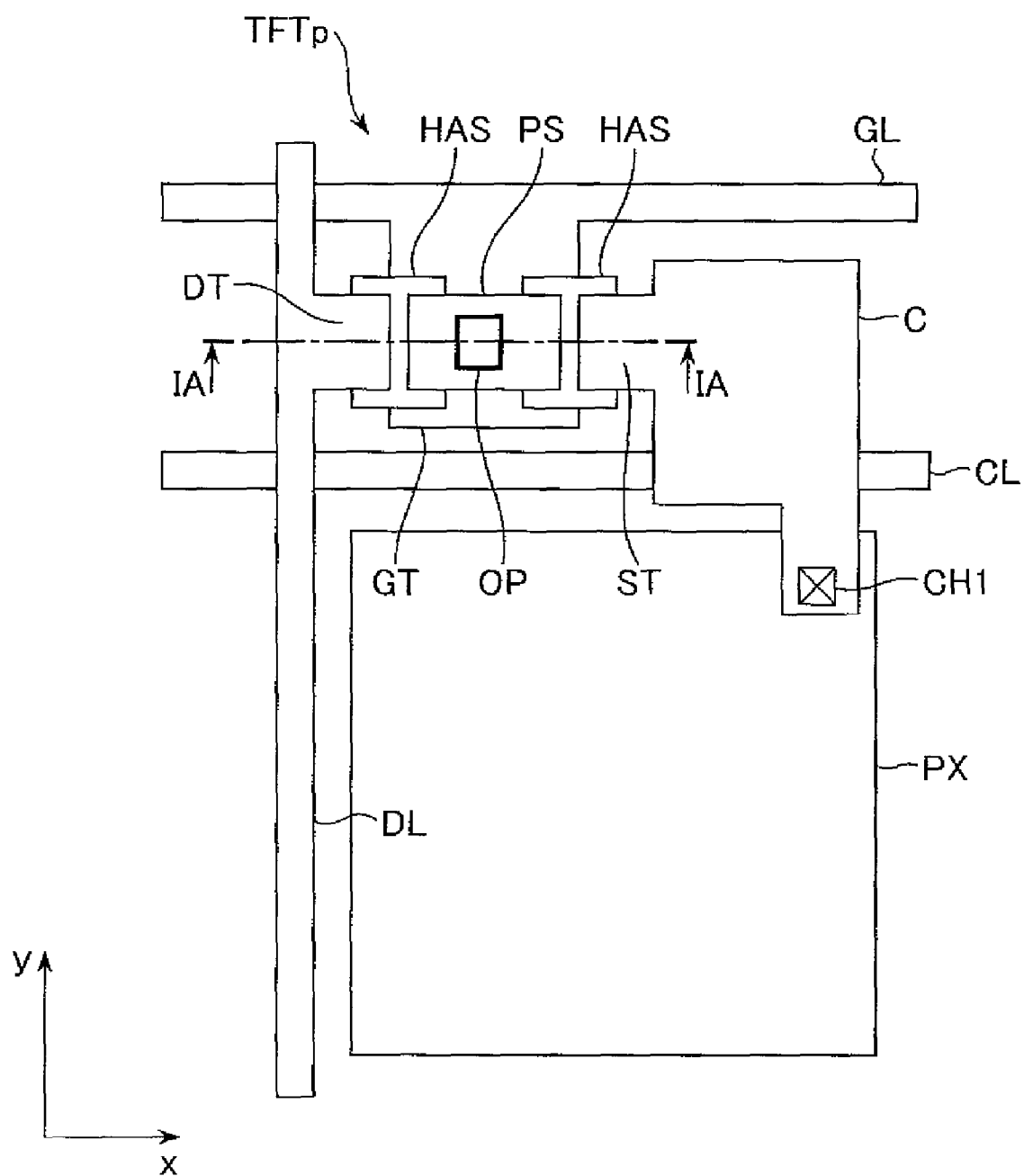
FIG. 3 is a plan view of a pixel illustrating the first embodiment of the display device according to the present invention.

FIG. 3 is a plan view illustrating a structure of the pixel area (area surrounded by the dot-line frame A illustrated in FIG. 2). A cross section taken along a line IA-IA of FIG. 3 is illustrated in FIG. 1A.

In FIG. 3, a substrate SUB1 (see FIG. 1A) is provided. The gate signal line GL is formed on a surface of the substrate SUB1. A gate electrode GT corresponding to a projecting portion formed on the gate signal line GL, is integrally formed with a part of the gate signal line GL. The common signal line CL is formed on the surface of the substrate SUB1 in the proximity of the gate signal line GL to be parallel to the gate signal line GL.

On the upper surface of the substrate SUB1, an insulating film GI (see FIG. 1A) is formed so as to cover the gate signal line GL (gate electrode GT) and the common signal line CL. The insulating film GI functions as a gate insulating film in an area where the thin-film transistor TFTp is formed.

An interlayer insulating film IN (see FIG. 1A) is formed on the upper surface of the insulating film GI. The interlayer insulating film IN has a function of insulating the gate signal line GL and the drain signal line DL described later at an intersection between the gate signal line GL and the drain signal line DL. The interlayer insulating film IN has an opening OP formed in an area where the gate electrode GT is formed in plan view. A surface of the insulating film CI is exposed through the opening OP. The opening OP is formed to have a tapered side wall surface.

A pair of heavily-doped amorphous semiconductor films HAS are formed on the upper surface of the interlayer insulating film IN (the upper surface excluding the side wall surface of the opening OP), and are arranged with the opening OP interposed therebetween. The heavily-doped amorphous semiconductor films HAS are formed by heavily doping n-type impurities, for example, into amorphous silicon or the like. The heavily-doped amorphous semiconductor films HAS are respectively formed on the sides where a drain electrode DT and a source electrode ST described later are to be formed. The drain electrode DT and the source electrode ST are alternated depending on the application of a bias. However, the electrode illustrated on the left side and the electrode illustrated on the right side in the drawings are respectively referred to as the drain electrode and the source electrode for convenience herein. Each of the heavily-doped amorphous semiconductor films HAS functions as a contact layer for connection between a polycrystalline semiconductor film PS described later and each of the drain electrode DT and the source electrode ST.

An island-like polycrystalline semiconductor film PS made of, for example, polysilicon is formed on the interlayer insulating film IN. The polycrystalline semiconductor film PS is formed across the opening OP to cover, for example, the opening OP. The polycrystalline semiconductor film PS is formed such that its peripheral portion overlaps apart of each of the pair of heavily-doped amorphous semiconductor films HAS to be electrically connected to each of the pair of heavily-doped amorphous semiconductor films HAS. The thus formed polycrystalline semiconductor film PS functions as a semiconductor film of the thin-film transistor TFTp. In this case, a portion of the polycrystalline semiconductor film PS that is formed on the side wall surface of the opening OP of the interlayer insulating film IN is formed as an offset area OFS. Therefore, an electric field at the end of the drain may be limited to reduce an off current. The polycrystalline semiconductor film PS is formed within, and without protruding from, the area where the gate electrode GT is formed in plan view. Due to this structure light emitted from the backlight provided on the back side of the substrate SUB1 is blocked by the gate electrode GT so as to avoid the leak current, which may otherwise be generated in the polycrystalline semiconductor film PS by the irradiation of light.

The drain electrode DT and the source electrode ST are formed on the upper surface of the interlayer insulating film IN. The drain electrode DT is connected to the drain signal line DL, and the source electrode ST is arranged so as to be opposed to the drain electrode DT with the polycrystalline semiconductor film PS interposed between the drain electrode DT and the source electrode ST. The drain electrode DT and the source electrode ST are respectively formed to overlap the pair of heavily-doped amorphous semiconductor films HAS, and not to overlap the polycrystalline semiconductor film PS. Therefore, it is possible to avoid an increase in the off-leak current, which may be caused if the drain electrode DT and the source electrode ST directly contact the polycrystalline semiconductor film PS.

As illustrated in FIG. 3, the source electrode ST extends so as to superimpose the common signal line CL. An end of the source electrode ST is electrically connected to the pixel electrode PX described later. The capacitor C is formed in a superimposing portion of the source electrode ST and the common signal line CL.

On the upper surface of the substrate SUB1, a protective film (not shown) is formed so as to cover the drain signal line DL, the drain electrode DT, and the source electrode ST. On an upper surface of the protective film, the pixel electrode PX made of a transparent conductive film such as an indium tin oxide (ITO) film is formed. The pixel electrode PX is connected to the source electrode ST of the thin-film transistor TFTp through a contact hole CH1 which is formed in advance through the protective film.

In the thus configured thin-film transistor TFTp, the polycrystalline semiconductor film PS is formed to cover the opening OP formed in the interlayer insulating film IN, and the portion of the polycrystalline semiconductor film PS that is formed on the side wall surface of the opening OP serves as the offset area. Therefore, the electric field at the end of the drain can be limited to reduce an off current.

Further, in the thus configured thin-film transistor TFTp, the polycrystalline semiconductor film PS and the drain electrode DT, and the polycrystalline semiconductor film PS and the source electrode ST, are respectively connected via the heavily-doped amorphous semiconductor film HAS so as to avoid direct contact between the polycrystalline semiconductor film PS and each of the drain electrode DT and the source electrode ST. As a result, an off-leak current can be reduced so as to enhance contrast of the liquid crystal display device.

Further, in the thus configured thin-film transistor TFTp, the interlayer insulating film with a relatively large thickness is formed between the gate electrode GT and the drain electrode DT, and between the gate electrode GT and the source electrode ST. Therefore, the parasitic capacitance at the intersection between the gate signal line GL and the drain signal line DL can be reduced.

Further, in the thus configured thin-film transistor TFTp, the area of the polycrystalline semiconductor film PS in plan view can be reduced so as to facilitate placing the polycrystalline semiconductor film PS within the area of the gate electrode GT. Therefore, the light emitted from the backlight through the substrate SUB1 can be blocked by the gate electrode GT to avoid irradiation of the polycrystalline semiconductor film PS. Thus, a photo-leakage current may be reduced.

(Structure of Part of Gate Driver GDR)

FIG. 4 is a plan view of the bootstrap circuit constituting a part of the gate driver GDR. The bootstrap circuit is illustrated in FIG. 4 so as to geometrically correspond to the bootstrap circuit (equivalent circuit) illustrated in FIG. 2. A cross section taken along a line IA-IA in FIG. 4 is illustrated in FIG. 1A. A cross section taken along a line IB-IB in FIG. 4 is illustrated in FIG. 1B.

In FIG. 4, three thin-film transistors TFTc are formed (respectively denoted by TFTc (1), TFTc (2), and TFTc (3) in FIG. 4). The thin-film transistors TFTc (1), TFTc (2), and TFTc (3) are formed in parallel to the thin-film transistors TFTp respectively included in the pixels when forming the thin-film transistors TFTp. Therefore, each of the thin-film transistors TFTc (1), TFTc (2), and TFTc (3) is formed as a bottom-gate type thin-film transistor as illustrated in FIG. 1A. The polycrystalline semiconductor film PS is formed so as to cover the opening OP that is formed in the interlayer insulating film IN formed in advance and to be connected to each of the drain electrode DT and the source electrode ST via the heavily-doped amorphous semiconductor film HAS.

The thin-film transistor TFTc (1) is configured to function as a diode, with the drain electrode DT electrically connected to the gate electrode GT. As illustrated in FIG. 1B, a contact hole CH2 is formed in the interlayer insulating film IN and the insulating film GI under the interlayer insulating film IN. A portion of a gate electrode GT' (an electrode formed by elongating the gate electrode GT of the thin-film transistor TFTc) is exposed through the contact hole CH2. The drain electrode DT is formed to cover the contact hole CH2 so as to be electrically connected to the gate electrode GT'.

Each of the thin-film transistors TFTc formed in the gate driver GDR includes the polycrystalline semiconductor film PS which is formed without protruding from the gate electrode GT in plan view. Such a structure is for blocking the light emitted from the backlight provided on the back side of the substrate SUB1 by the gate electrode GT so as to avoid the leak current, which may otherwise be generated in the polycrystalline semiconductor film PS by the irradiation of light.

The thin-film transistors TFTc described above correspond to the thin-film transistors formed in the gate driver GDR. However, the structure of the thin-film transistors as described above is also applicable to the thin-film transistors formed in the drain driver DDR. In short, the above-mentioned structure may be applied to the thin-film transistors constituting a circuit formed in the periphery of the display area (peripheral circuit).

In the thus formed thin-film transistor TFTc (1), the gate electrode GT' and the drain electrode DT are connected directly without any other conductive layer interposed between the gate electrode GT' and the drain electrode DT. Therefore, the diameter of the contact hole CH2 can be reduced to improve the integration degree of the thin-film transistor TFTc (1).

(Manufacturing Method)

FIGS. 5A to 5C, 6A to 6C, and 7A and 7B respectively illustrate the steps of a method of manufacturing the thin-film transistor provided in the display device according to the present invention, and illustrate steps performed in areas corresponding to FIGS. 1A and 1B. Hereinafter, the manufacturing process is described in order of steps.

Figure 5A:
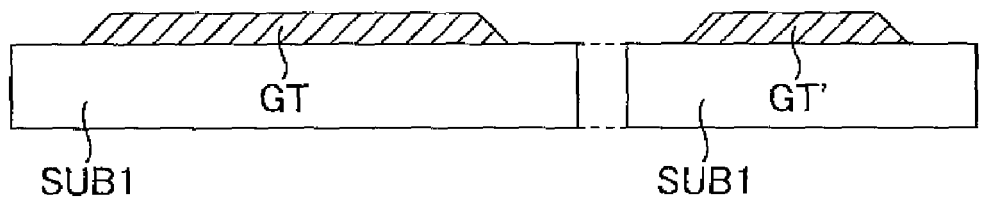
FIG. 5A is a view illustrating a step of the first embodiment of a method of manufacturing the display device according to the present invention, and illustrates a series of steps together with FIGS. 6 and 7.

Step 1 (FIG. 5A)

The substrate SUB1 made of, for example, glass is prepared. A metal film (with a thickness of about 150 nm) made of, for example, aluminum is formed on a surface of the substrate SUB1, and gate electrode GT, GT' is formed using selective etching according to a photolithography technique to form.

Figure 5B:
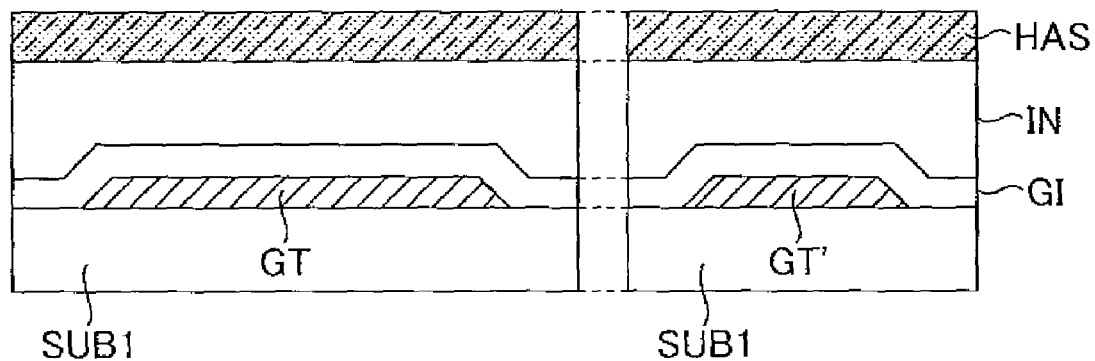
FIG. 5B is a view illustrating a step of the first embodiment of the method of manufacturing the display device according to the present invention, and illustrates a series of steps together with FIGS. 6 and 7.

Step 2 (FIG. 5B)

On the surface of the substrate SUB1, the gate insulating film GI made of, for example, a silicon oxide film (with a thickness of about 100 nm), the interlayer insulating film IN made of, for example, a silicon nitride film (with a thickness of about 500 nm), and the heavily-doped amorphous semiconductor film HAS made of, for example, a heavily-doped amorphous silicon film (100 nm) are sequentially formed to cover the gate electrode GT, GT'. The gate insulating film GI, the interlayer insulating film IN, and the heavily-doped amorphous semiconductor film HAS are continuously formed using, for example, a chemical vapor deposition (CVD) method.

Figure 5C:
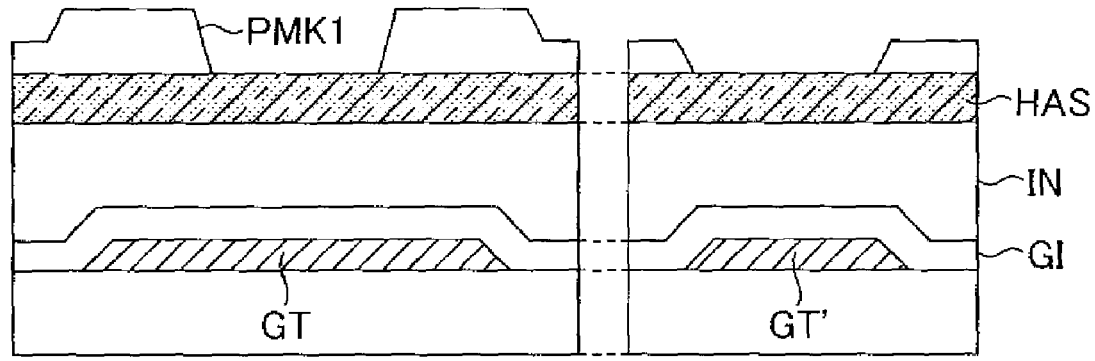
FIG. 5C is a view illustrating a step of the first embodiment of the method of manufacturing the display device according to the present invention, and illustrates a series of steps together with FIGS. 6 and 7.

Step 3 (FIG. 5C)

A photoresist film is formed on the upper surface of the heavily-doped amorphous semiconductor film HAS, and subjected to a photolithography technique according to so-called half-tone exposure, to thereby form a photomask PMK1 with two different thicknesses. The photomask PMK1 is formed with openings at a portion equivalent to a channel area of the thin-film transistor TFT and at a portion where the gate electrode GT and the drain electrode DT of the thin-film transistor TFT are to be connected in plan view. The photomask PMK1 is formed to be thicker in the periphery of the portion equivalent to the channel area of the thin-film transistor TFT, and to be thinner at other portions.

Figure 6A:
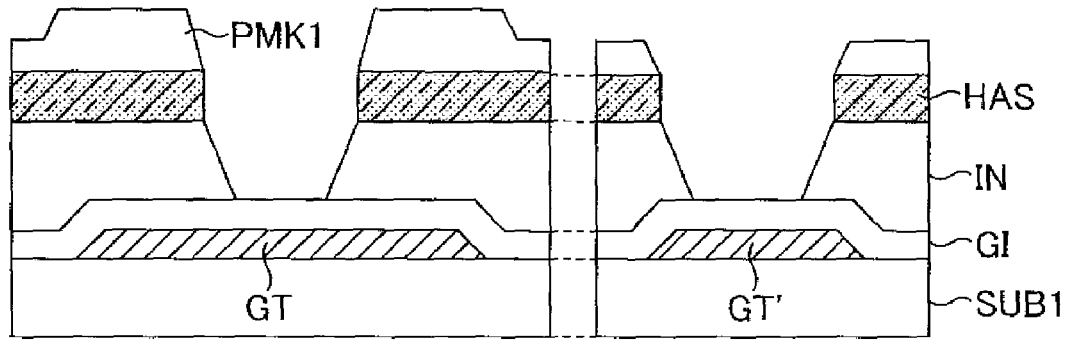
FIG. 6A is a view illustrating a step of the first embodiment of the method of manufacturing the display device according to the present invention, and illustrates a series of steps together with FIGS. 5A to 5C and 7A and 7B.

Step 4 (FIG. 6A)

A portion of the heavily-doped amorphous semiconductor film HAS that is exposed from the photomask PMK1 is removed by dry etching. Next, a portion of the interlayer insulating film TN that is exposed from the heavily-doped amorphous semiconductor film HAS is removed by wet etching. An opening formed by the wet etching of the interlayer insulating film IN is formed so as to have a tapered side wall surface. The wet etching is performed such that the gate insulating film GI under the interlayer insulating film IN is not removed too much. This is because the silicon oxide film constituting the gate insulating film GI and the silicon nitride film constituting the interlayer insulating film IN have different etching rates.

Figure 6B:
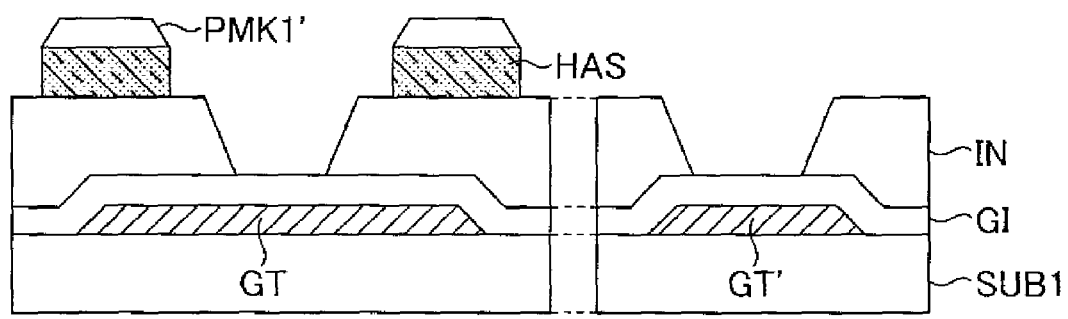
FIG. 6B is a view illustrating a step of the first embodiment of the method of manufacturing the display device according to the present invention, and illustrates a series of steps together with FIGS. 5A to 5C and 7A and 7B.

Step 5 (FIG. 6B)

The photomask PMK1 is subjected to a half-asking process such that the photoresist film remains only at the portion in the periphery of the channel area of the thin-film transistor TFT in plan view. The remaining photoresist film (hereinafter referred to as a photomask PMK1') is equivalent to the portion formed thicker of the photomask PMK1 formed in Step 3 described above. Next, a portion of the heavily-doped amorphous semiconductor film HAS that is exposed from the photomask PMK1' is removed by, for example, dry etching such that the heavily-doped amorphous semiconductor film HAS under the photomask PMK1 remains.

Figure 6C:
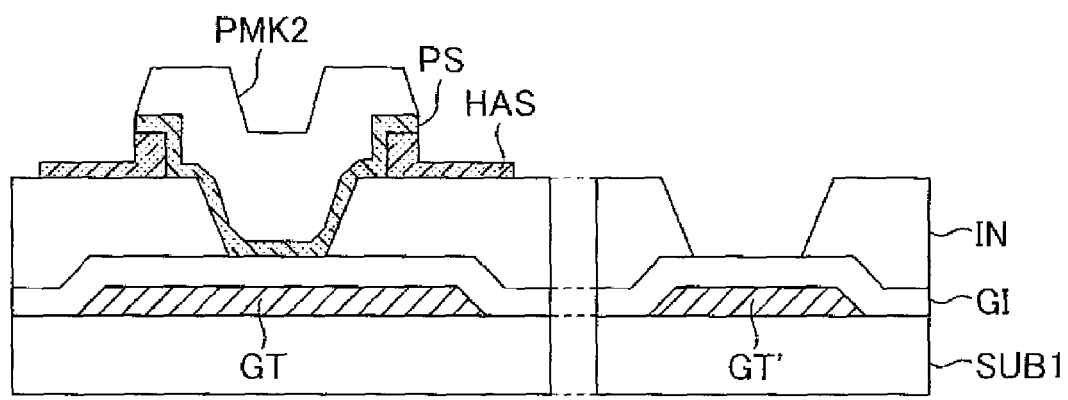
FIG. 6C is a view illustrating a step of the first embodiment of the method of manufacturing the display device according to the present invention, and illustrates a series of steps together with FIGS. 5A to 5C and 7A and 7B.

Step 6 (FIG. 6C)

After the photomask PMK1' is removed, an amorphous semiconductor film made of an amorphous silicon film (with a thickness of about 50 nm) is formed by, for example, the CVD method. Next, the amorphous semiconductor film is crystallized by laser annealing to form the polycrystalline semiconductor film PS made of a polysilicon film.

Then, a photoresist film is formed on the upper surface of the polycrystalline semiconductor film PS, and subjected to the photolithography technique to form a photomask PMK2. The photomask PMK2 is formed at the portion equivalent to the channel area of the thin-film transistor TFT in plan view, and superimposes a part of each of the heavily-doped amorphous semiconductor films HAS formed on both sides of the portion so as to form a pattern.

Next, a portion of the polycrystalline semiconductor film PS that is exposed from the photomask PMK2 is removed such that the polycrystalline semiconductor film PS under the photomask PMK2 remains. In this case, surfaces of the heavily-doped amorphous semiconductor films HAS under the polycrystalline semiconductor film PS are slightly etched as well. This is the reason that the heavily-doped amorphous semiconductor film HAS formed in Step 2 preferably has a thickness of about 50 nm or more.

Figure 7A:
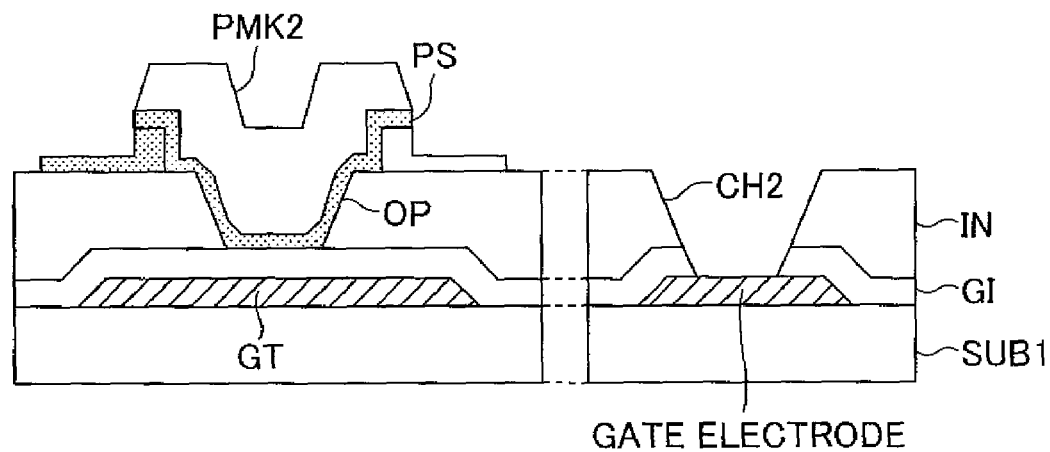
FIG. 7A is a view illustrating a step of the first embodiment of the method of manufacturing the display device according to the present invention, and illustrates a series of steps together with FIGS. 5A to 5C and 6A to 6C.

Step 7 (FIG. 7A)

While the photomask PMK2 remaining, at the area where the gate electrode GT and the source electrode ST of the thin-film transistors TFT are to be connected, a portion of the gate insulating film GI that is exposed through the hole formed in the interlayer insulating film IN is removed by dry etching. As a result, the contact hole CH2 is formed so as to expose a part of the gate electrode GT.

Figure 7B:
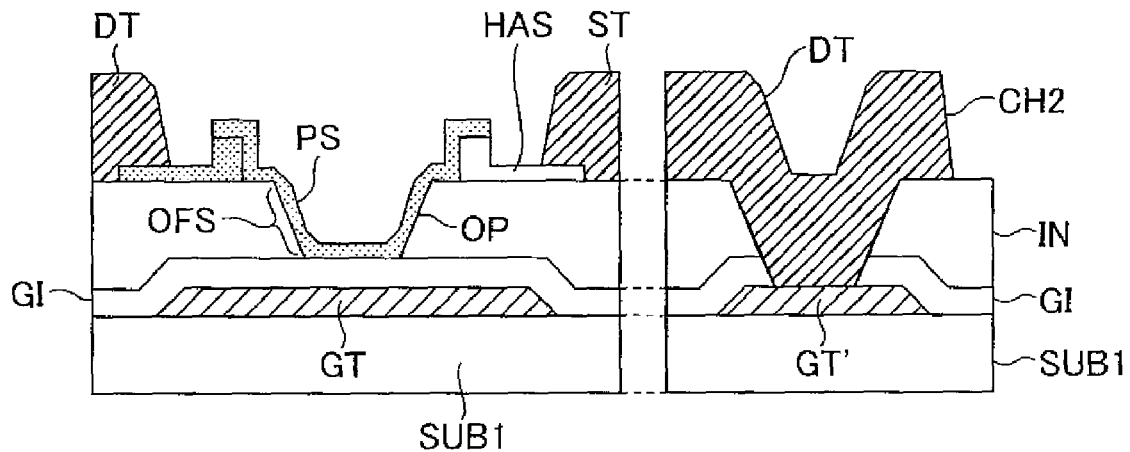
FIG. 7B is a view illustrating a step of the first embodiment of the method of manufacturing the display device according to the present invention, and illustrates a series of steps together with FIGS. 5A to 5C and 6A to 6C.

Step 8 (FIG. 7B)

The photomask PMK2 is removed. Then, a metal film made of, for example, aluminum is farmed, and subjected to selective etching according to the photolithography technique to form the drain electrode DT and the source electrode ST Each of the drain electrode DT and the source electrode ST is formed to superimpose the heavily-doped amorphous semiconductor film HAS at their peripheral ends on the side of the channel area of the thin-film transistor TFT in plan view, and is thus electrically connected to the polycrystalline semiconductor film PS. The drain electrode DT is electrically connected to the gate electrode GT' of the thin-film transistor TFT through the contact hole CH2.

According to the method of manufacturing the thin-film transistor TFT configured as described above, the photomask for the patterning of the polycrystalline semiconductor film PS is also used in the formation of the contact hole CH2 which serves as the area where the gate electrode GT and the source electrode ST are to be connected. Therefore, an increase in the number of photo processes can be avoided.

Further, according to the method of manufacturing the thin-film transistor TFT configured as described above, the gate electrode GT and the drain electrode DT are electrically connected in the contact hole CH2 directly without any other conductive film interposed between the gate electrode GT and the drain electrode DT, such as transparent conductive film. Thus, the area of the contact hole in plan view may be reduced. Therefore, the area of the peripheral circuit can be reduced to achieve so-called frame narrowing of the liquid crystal display device. Further, it is not necessary to increase the side-etching amounts of the drain electrode DT and the source electrode ST. Therefore, the area of the peripheral circuit can be reduced, to thereby achieve the so-called frame narrowing of the area of the peripheral circuit in the liquid crystal display device.

Second Embodiment

Figure 8:
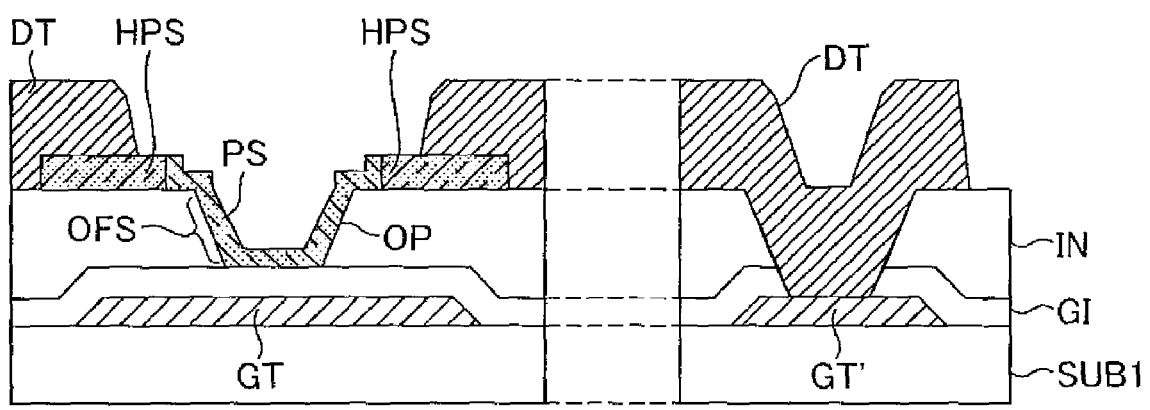
FIG. 8 is a view illustrating a structure of an essential portion of a second embodiment of a display device according to the present invention, and illustrates thin-film transistors.

FIG. 8 illustrates a structure of a thin-film transistor TFT provided in a display device according to a second embodiment of the present invention, which corresponds to FIGS. 1A and 1B.

The structure illustrated in FIG. 8 differs from that illustrated in FIGS. 1A and 1B in that each of heavily-doped polycrystalline semiconductor films HPS functions as the contact layer, and in that the polycrystalline semiconductor film PS and the heavily-doped polycrystalline semiconductor films HPS are electrically connected by contacting the side wall surfaces of the polycrystalline semiconductor film PS and side wall surfaces of the heavily-doped polycrystalline semiconductor films HPS to each other. In the structure described above, the heavily-doped polycrystalline semiconductor films HPS are configured to be thicker than a portion of the polycrystalline semiconductor film PS that is formed across the opening OP of the interlayer insulating film IN due to the peculiarity in the manufacturing method.

An example of the method of manufacturing the thin-film transistor TFT illustrated in FIG. 8 is illustrated in FIGS. 9A to 9D. Hereinafter, the manufacturing process is described in order of steps.

Figure 9A:
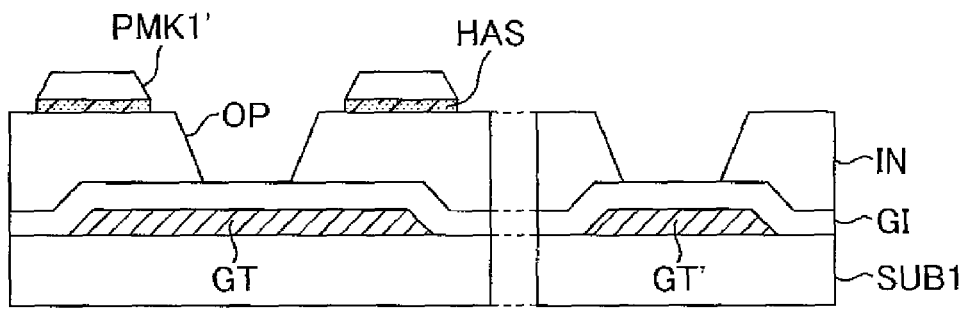
FIG. 9A is a view illustrating a step of the second embodiment of a method of manufacturing the display device according to the present invention.

Step 1 (FIG. 9A)

This step includes steps of the manufacturing method of the first embodiment illustrated in FIGS. 5A to 6B. It should be noted, however, that the heavily-doped amorphous semiconductor films HAS formed in FIG. 6B are formed to be relatively thin (with a thickness of about 25 nm). Therefore, the heavily-doped amorphous semiconductor films HAS illustrated in FIG. 9A are depicted to be thinner than the heavily-doped amorphous semiconductor films HAS illustrated in FIG. 6B.

Figure 9B:
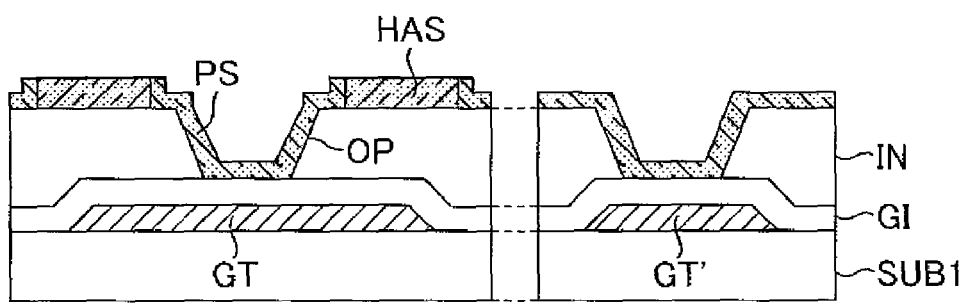
FIG. 9B is a view illustrating a step of the second embodiment of the method of manufacturing the display device according to the present invention.

Step 2 (FIG. 9B)

The photomask PMK1' illustrated in FIG. 9A is removed. Next, an amorphous semiconductor film AS made of an amorphous silicon film (with a thickness of about 50 nm) is formed using, for example, the CVD method. Then, the amorphous semiconductor film AS is crystallized by, for example, laser annealing to form the polycrystalline semiconductor film PS made of a polysilicon film. In this case, by increasing the laser power, impurities are diffused from the heavily-doped amorphous semiconductor films HAS into a portion of the polycrystalline semiconductor film PS which is formed to overlap the heavily-doped amorphous semiconductor films HAS. As a result, heavily-doped polycrystalline semiconductor films HPS made of a heavily-doped polysilicon film are formed.

Figure 9C:
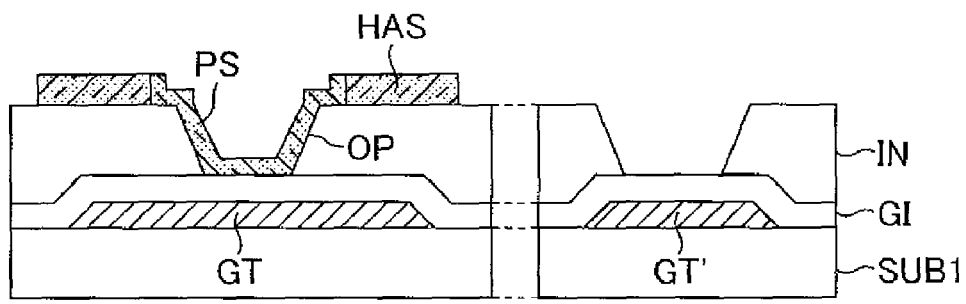
FIG. 9C is a view illustrating a step of the second embodiment of the method of manufacturing the display device according to the present invention.

Step 3 (FIG. 9C)

The polycrystalline semiconductor film PS formed as described above is subjected to selective etching according to the photolithography technique such that portions of the polycrystalline semiconductor film PS, which are formed outside the heavily-doped polycrystalline semiconductor films HAS, are removed with a portion of the polycrystalline semiconductor film PS, which is formed in a groove of the interlayer insulating film IN, and portions of the heavily-doped polycrystalline semiconductor films HAS, which are formed outside the polycrystalline semiconductor film PS remain.

Figure 9D:
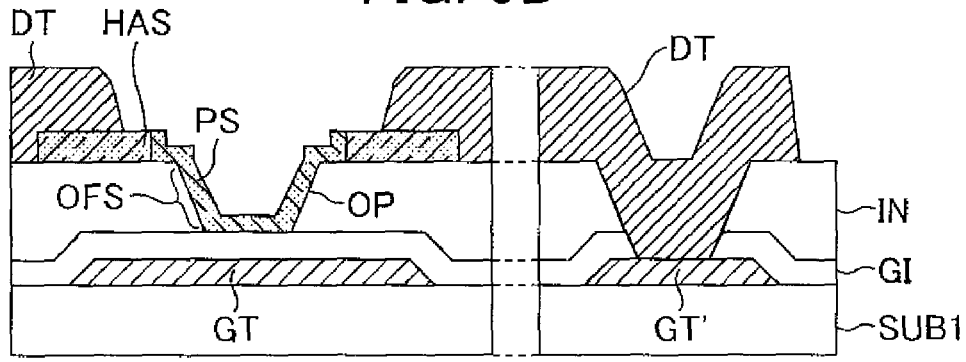
FIG. 9D is a view illustrating a step of the second embodiment of the method of manufacturing the display device according to the present invention.

Step 4 (FIG. 9D)

A metal film made of, for example, aluminum is formed, and is subjected to selective etching according to the photolithography technique, to thereby form the drain electrode DT and the source electrode ST. Each of the drain electrode DT and the source electrode ST is formed to superimpose the heavily-doped amorphous semiconductor film HAS at their peripheral ends on the side of the channel area of the thin-film transistor TFT in plan view, and is thus electrically connected to the polycrystalline semiconductor film PS. The drain electrode DT is electrically connected to the gate electrode GT' of the thin-film transistor TFT through the contact hole CH2.

According to the manufacturing method configured as described above, the polycrystalline semiconductor film PS in the channel area and the heavily-doped polycrystalline semiconductor films HPS in the contact area can be formed in Step 2 described above in which the amorphous semiconductor film AS is crystallized without increasing the thickness of the heavily-doped amorphous semiconductor films HAS. Therefore, the amount of gas used in the formation of the heavily-doped amorphous semiconductor film HAS can be reduced, to thereby improve the efficiency of the CVD method.

According to the method of manufacturing the thin-film transistor TFT configured as described above, the layout pattern of the polycrystalline semiconductor film PS and the layout patterns of the drain electrode DT and the source electrode ST may be overlapped to reduce the area of the thin-film transistor TFT. Therefore, the ratio of the opening in each pixel may be improved, or the area of the peripheral circuit may be reduced.

Third Embodiment

Figure 10:
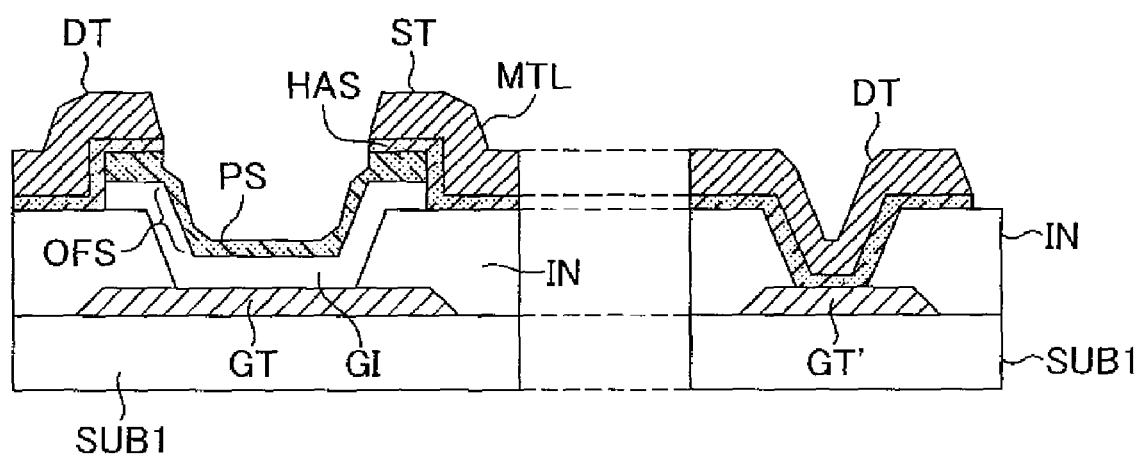
FIG. 10 is a view illustrating a structure of an essential portion of a third embodiment of a display device according to the present invention, and illustrates thin-film transistors.

FIG. 10 is a cross-sectional view of a thin-film transistor TFT provided in a display device according to a third embodiment of the present invention, which corresponds to FIGS. 1A and 1B.

Figure 11:
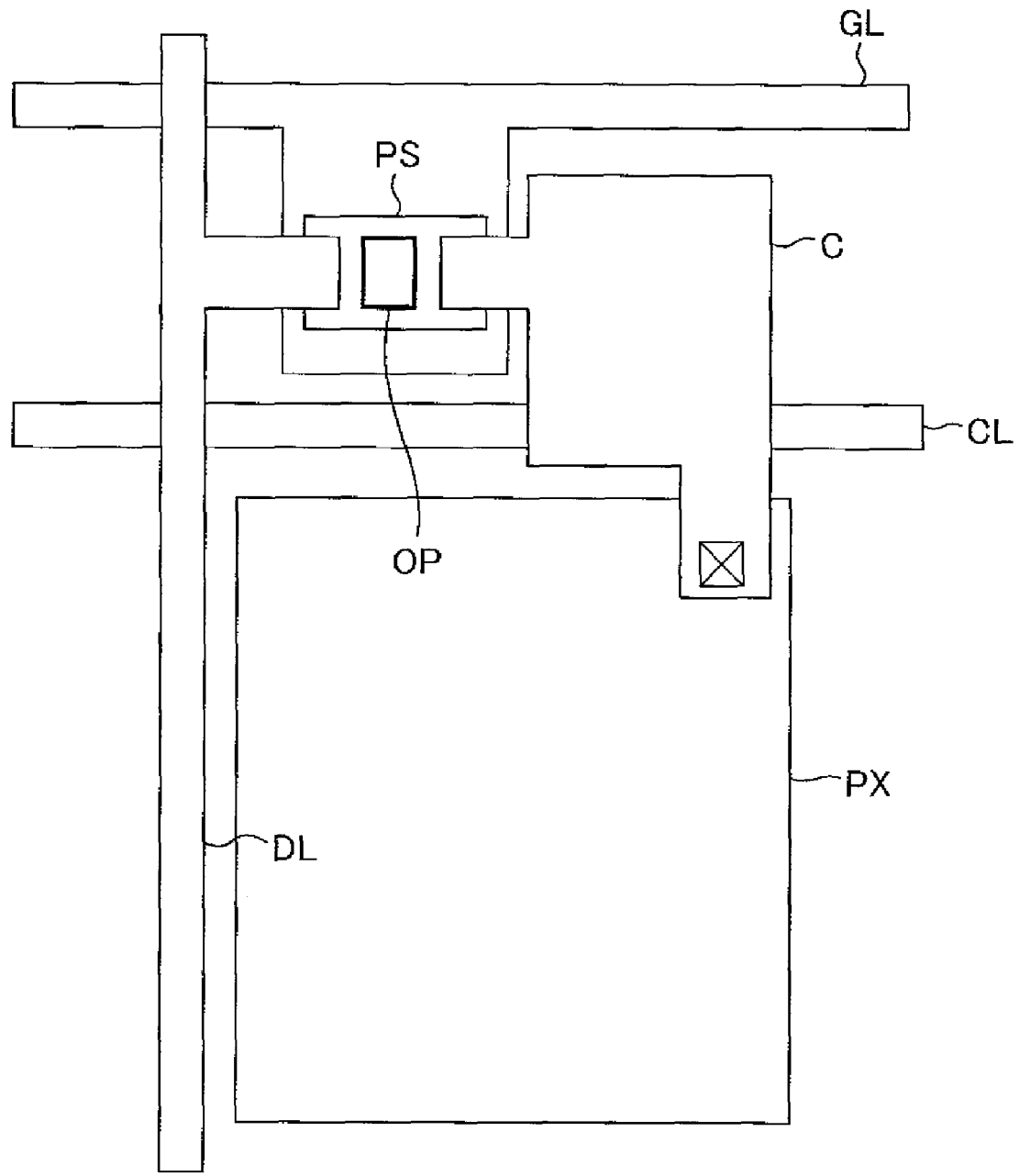
FIG. 11 is a plan view of a pixel illustrating the third embodiment of the display device according to the present invention.
Figure 12:
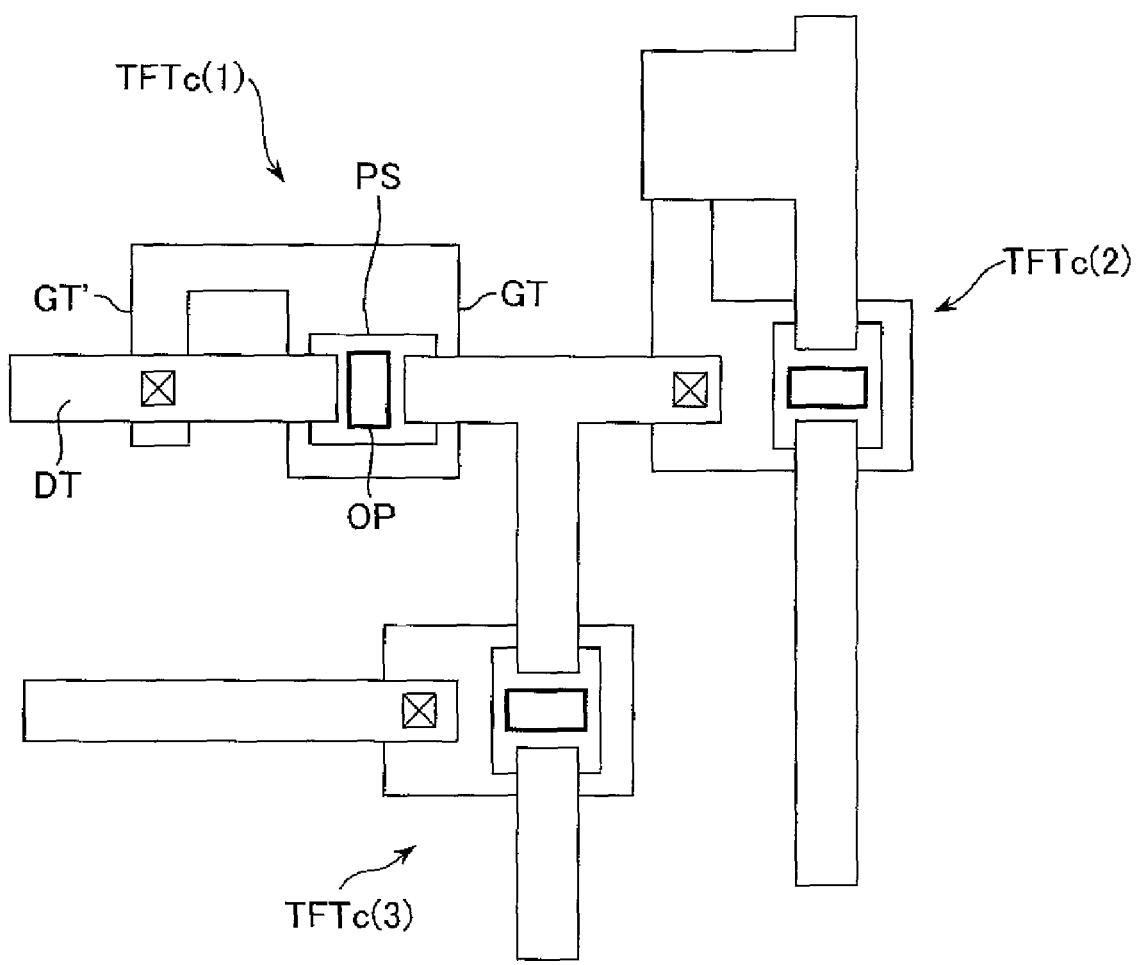
FIG. 12 is a plan view of a bootstrap circuit illustrating the third embodiment of the display device according to the present invention.

In this case, the structure of the pixel is illustrated in FIG. 11, which corresponds to FIG. 3, and the structure of the bootstrap circuit is illustrated in FIG. 12, which corresponds to FIG. 4.

The structure illustrated in FIG. 10 differs from that illustrated in FIGS. 1A and 1B as follows. First, the interlayer insulating film IN with openings is formed over the gate electrode GT, GT', and portions of the gate electrode GT, GT' are exposed through the openings, respectively. Then, an island-like laminate obtained by sequentially laminating the insulating film GI and the polycrystalline semiconductor film PS is formed so as to cover one of the openings formed in the interlayer insulating film IN through which the gate electrode GT is exposed. Also, in this case, a portion of the polycrystalline semiconductor film PS at the bottom of the opening forms the channel area, and a portion of the polycrystalline semiconductor film PS on the side wall surface of the opening forms the offset area OFS. Each of the drain electrode DT and the source electrode ST is formed of a laminate obtained by sequentially laminating the heavily-doped amorphous semiconductor film HAS made of, for example, heavily-doped amorphous silicon and a metal film MTL made of, for example, aluminum in the same pattern. This is the reason that the thin-film transistor TFTp illustrated in FIG. 11 and the thin-film transistors TFTc illustrated in FIG. 12 are depicted such that each of the heavily-doped amorphous semiconductor films HAS serving as the contact layer does not protrude from the drain electrode DT and the source electrode ST. The drain electrode DT is formed to overlap a part of the insulating film GI and the polycrystalline semiconductor film PS formed to protrude from the opening of the interlayer insulating film IN. The source electrode ST is formed to overlap a part of the insulating film GI and the polycrystalline semiconductor film PS formed to protrude from the opening of the interlayer insulating film IN. As a result, the drain electrode DT and the polycrystalline semiconductor film PS, and the source electrode ST and the polycrystalline semiconductor film PS, are respectively electrically connected via the heavily-doped amorphous semiconductor film HAS serving as the contact layer.

One of the openings formed in the interlayer insulating film IN through which the gate electrode GT' is exposed forms the through hole CH2. The drain electrode DT and the gate electrode GT' are electrically connected in the through hole CH2.

(Manufacturing Method)

FIGS. 13A to 13D illustrate an example of the method of manufacturing the thin-film transistor illustrated in FIG. 10, each illustrating each of a series of steps. Hereinafter, the manufacturing process is described in order of steps.

Figure 13A:
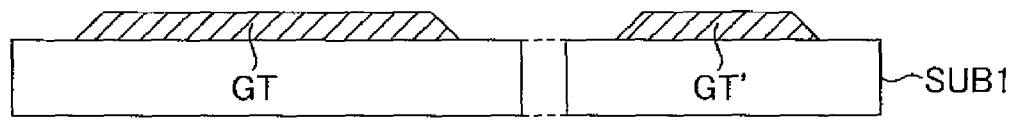
FIG. 13A is a view illustrating a step of the third embodiment of a method of manufacturing the display device according to the present invention.

Step 1 (FIG. 13A)

The substrate SUB1 made of, for example, glass is prepared. A metal film (with a thickness of about 150 nm) made of, for example, aluminum is formed on a surface of the substrate SUB1, and subjected to selective etching according to a photolithography technique to form the gate electrode GT, GT'.

Figure 13B:
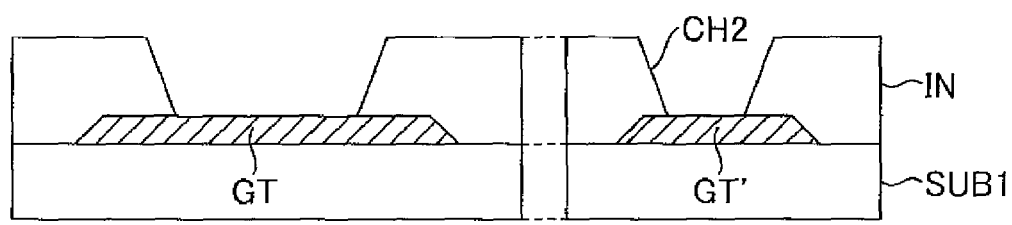
FIG. 13B is a view illustrating a step of the third embodiment of the method of manufacturing the display device according to the present invention.

Step 2 (FIG. 13B)

The interlayer insulating film IN made of, for example, a silicon oxide film (with a thickness of about 500 nm) is formed on the surface of the substrate SUB1 to cover the gate electrode GT, GT'. Next, the interlayer insulating film IN is formed with an opening at a portion equivalent to the channel area of the thin-film transistor TFT and with an opening at a portion equivalent to the area where the gate electrode GT' and the source electrode ST of the thin-film transistor TFT are to be connected. The latter opening serves as the contact hole CH2.

Figure 13C:
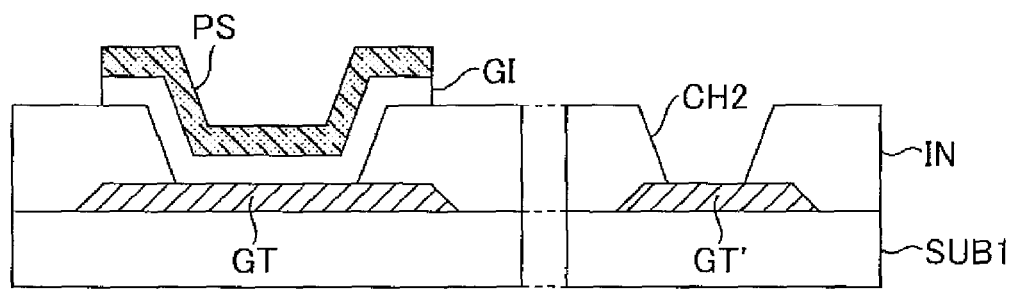
FIG. 13C is a view illustrating a step of the third embodiment of the method of manufacturing the display device according to the present invention.

Step 3 (FIG. 13C)

The gate insulating film GI made of a silicon oxide film (100 nm) and the amorphous semiconductor film AS made of an amorphous silicon film (100 nm) are sequentially formed on a surface of the interlayer insulating film IN using, for example, the CVD method to cover the openings. Then, the amorphous semiconductor film AS is crystallized by, for example, laser annealing to form the polycrystalline semiconductor film PS.

Then, the polycrystalline semiconductor film PS and the gate insulating film GI under the polycrystalline semiconductor film PS are subjected to selective etching according to the photolithography technique such that the polycrystalline semiconductor film PS and the gate insulating film GI remain in the area where the thin-film transistor is to be formed and are processed to have an island shape. It is preferred that the etching in this step be performed by, for example, dry etching. An island-like laminated film, which is obtained by sequentially laminating the gate insulating film GI and the polycrystalline semiconductor film PS, is formed to cover the opening formed in the interlayer insulating film IN and for a peripheral portion of the laminated film to reach the upper surface of the interlayer insulating film IN.

Figure 13D:
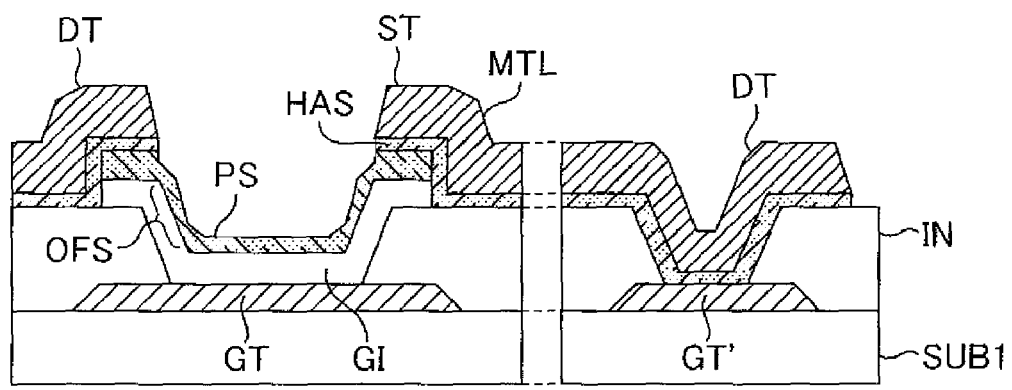
FIG. 13D is a view illustrating a step of the third embodiment of the method of manufacturing the display device according to the present invention.

Step 4 (FIG. 13D)

A laminated film obtained by sequentially laminating the heavily-doped amorphous semiconductor film HAS made of heavily-doped amorphous silicon (with a thickness of about 25 nm) and the metal film MTL made of, for example, aluminum (with a thickness of about 500 nm) is formed, and subjected to selective etching according to the photolithography technique, to thereby form the drain electrode DT and the source electrode ST. As a result, each of the drain electrode DT and the source electrode ST is formed of a laminated film obtained by sequentially laminating the heavily-doped amorphous semiconductor film HAS and the metal film Pin in the same pattern. Each of the drain electrode DT and the source electrode ST is formed on the interlayer insulating film IN such that a part of each of the drain electrode DT and the source electrode ST overlaps a portion of the polycrystalline semiconductor film PS that is formed on the upper surface of the interlayer insulating film IN (peripheral portion of the polycrystalline semiconductor film PS). The drain electrode DT is electrically connected to the gate electrode GT' of the thin-film transistor TFT through the contact hole CH2.

In the formation of the drain electrode DT and the source electrode ST by etching, a surface of the polycrystalline semiconductor film PS is slightly etched as well. Therefore, it is necessary to form the polycrystalline semiconductor film PS with a relatively large thickness (100 nm or more) in the step illustrated in FIG. 13C.

According to the manufacturing method configured as described above, the interlayer insulating film IN and the gate insulating film GI are formed by lamination. In this case, the parasitic capacitance at an overlapping area of the gate electrode GT and the drain electrode DT can be reduced by using a silicon oxide film, which is the same as the gate insulating film GI, as the interlayer insulating film IN. This is because the silicon oxide film has a lower specific inductive capacity than that of the silicon nitride film.

Fourth Embodiment

Figure 14:
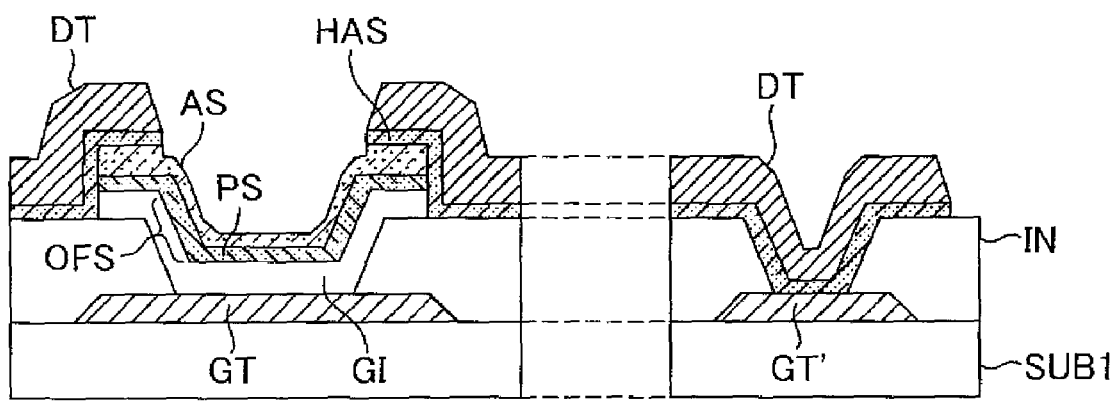
FIG. 14 is a view illustrating a structure of an essential portion of a fourth embodiment of a display device according to the present invention, and illustrates thin-film transistors.

FIG. 14 is a cross-sectional view of a thin-film transistor TFT provided in a display device according to a fourth embodiment of the present invention.

FIG. 14 corresponds to FIG. 10. The structure illustrated in FIG. 14 differs from that illustrated in FIG. 10 in that the amorphous semiconductor film AS made of an amorphous silicon film is laminated on the surface of the polycrystalline semiconductor film PS, and in that a part of each of the drain electrode DT and the source electrode ST is formed to overlap the amorphous semiconductor film AS.

In the thin-film transistor TFT configured accordingly, only the amorphous semiconductor film AS is subjected to surface etching of a semiconductor film that is exposed from the drain electrode DT and the source electrode ST when forming the drain electrode DT and the source electrode ST by etching. Therefore, damage by the etching to the polycrystalline semiconductor film PS, which is located under the amorphous semiconductor film AS to function as the channel layer, can be avoided.

Fifth Embodiment

Figure 15:
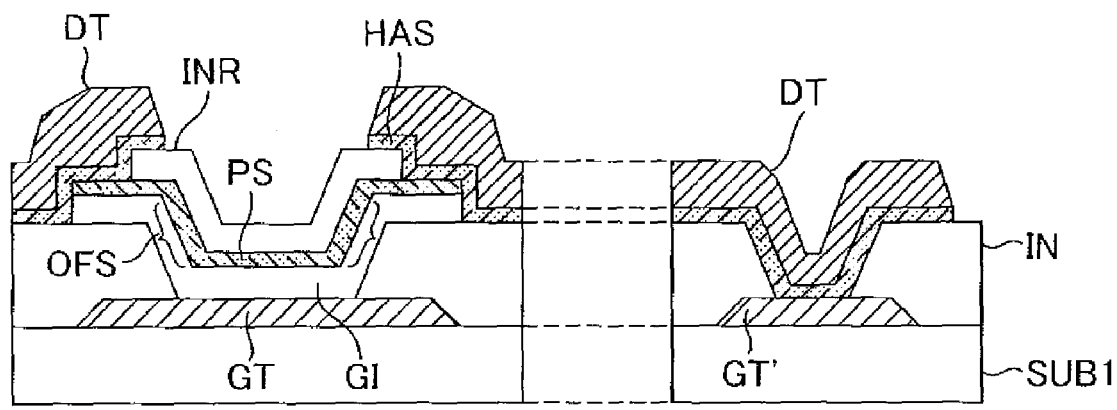
FIG. 15 is a view illustrating a structure of an essential portion of a fifth embodiment of a display device according to the present invention, and illustrates thin-film transistors.

FIG. 15 is a cross-sectional view of a thin-film transistor TFT provided in a display device according to a fifth embodiment of the present invention.

FIG. 15 corresponds to FIG. 10. The structure illustrated in FIG. 15 differs from that illustrated in FIG. 10 in that an inorganic insulating film INR made of, for example, a silicon oxide film (with a thickness of about 100 nm) is laminated on a surface of the polycrystalline semiconductor film PS. The inorganic insulating film INR is formed such that the insulating film GI and the polycrystalline semiconductor film PS sufficiently protrude from the inorganic insulating film INR in the area where the drain electrode DT and the source electrode ST are formed. The drain electrode DT and the source electrode ST overlap not only the polycrystalline semiconductor film PS but also the silicon oxide film.

In the thus configured thin-film transistor TFT, the inorganic insulating film INR functions as a stopper of etching when forming the drain electrode DT and the source electrode ST by etching. Therefore, damage by the etching to the polycrystalline semiconductor film PS, which is located under the inorganic insulating film INR to function as the channel layer can be avoided.

Sixth Embodiment

Figure 16:
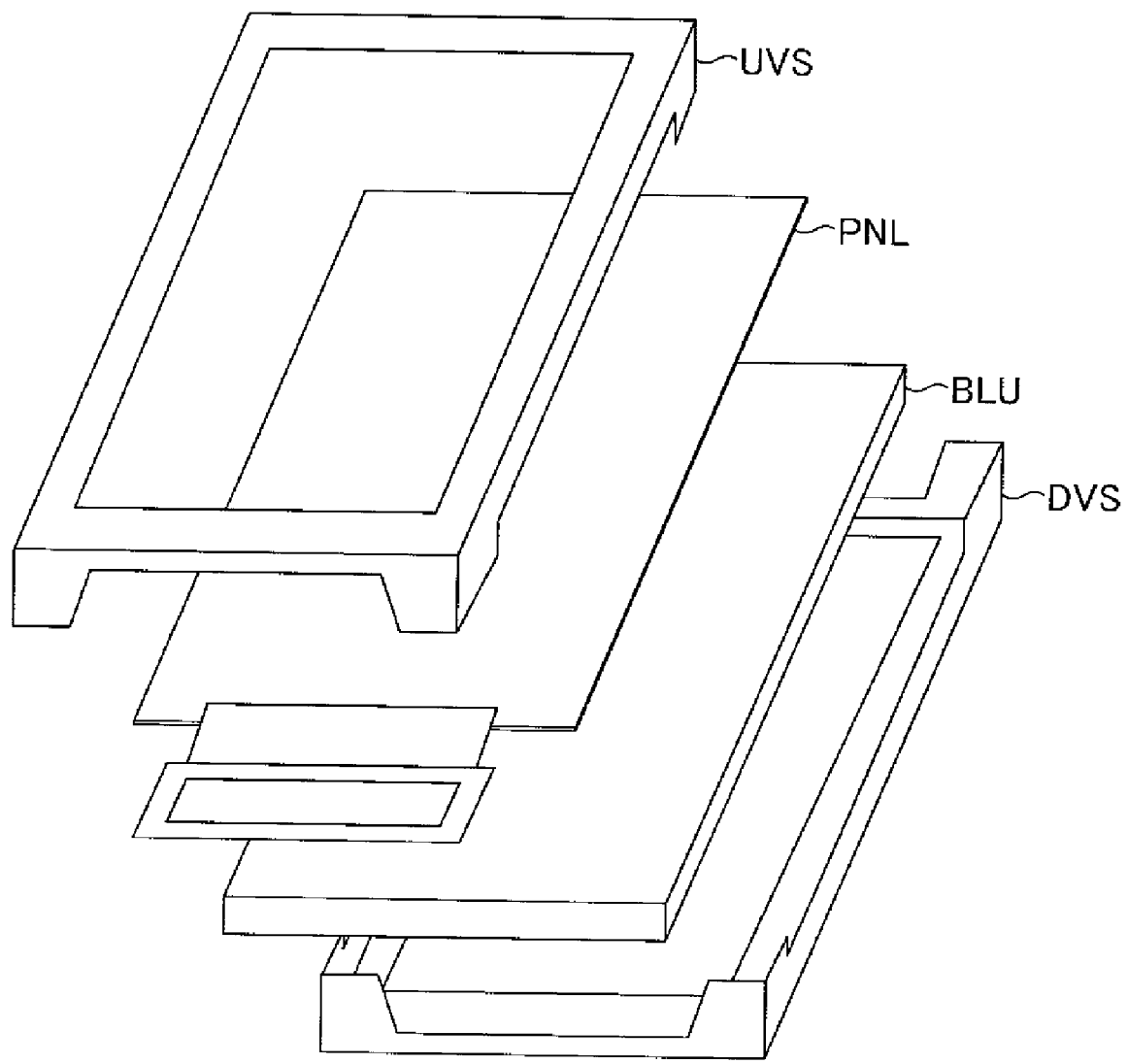
FIG. 16 is an exploded perspective view of an example of a liquid crystal display device provided with a liquid crystal display panel to which the present invention is applied.

FIG. 16 is an exploded perspective view of an example of a liquid crystal display device provided with a liquid crystal display panel PNL to which the present invention is applied. The liquid crystal display device is formed as a module in which the liquid crystal display panel PNL and a backlight unit BLU arranged to be opposed to each other are sandwiched between an upper bezel UVS and a lower bezel DVS.

Figure 17:
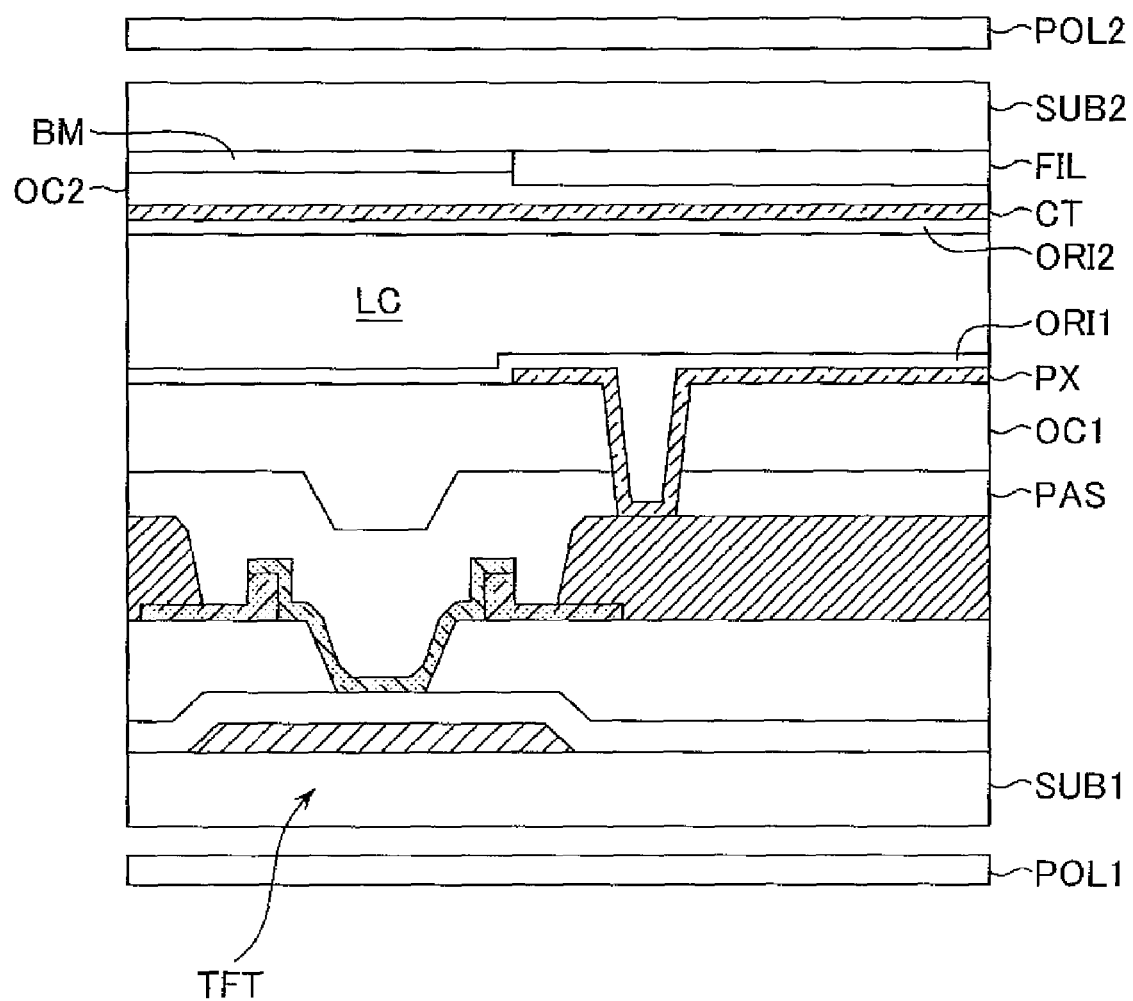
FIG. 17 is a cross-sectional view of the liquid crystal display panel taken at a portion where a thin-film transistor is formed.

FIG. 17 is a cross-sectional view of the liquid crystal display panel PNL taken at a portion where the thin-film transistor TFTp is formed. In FIG. 17, substrates SUM and SUB2 are arranged to be opposed to each other with a liquid crystal LC interposed between the substrates SUB1 and SUB2. On a surface of the substrate SUB1 on the side of the liquid crystal LC, the thin-film transistor TFTp configured as illustrated in, for example, FIGS. 1A and 1B is formed, and the pixel electrode PX made of a transparent electrode is formed via a protective insulating film PAS and a planarization film OC1. Further, an alignment film ORI1 is formed to cover the pixel electrode PX. A polarization plate POL1 is formed on a surface of the substrate SUB1 on the side opposite the liquid crystal LC. On a surface of the substrate SUB2 on the side of the liquid crystal LC, a black matrix (light shielding film) BM and a color filter FIL are formed, and a counter electrode CT is formed via a planarization film OC2. Further, an alignment film ORI2 is formed to cover the counter electrode CT. A polarization plate POL2 is formed on a surface of the substrate SUB2 on the side opposite the liquid crystal LC.

While the thin-film transistor TFTp illustrated in FIG. 17 has the same structure as that illustrated in FIG. 1, the thin-film transistor TFTp may have the same structure as the thin-film transistor TFTp illustrated in any of the other embodiments.

Seventh Embodiment

Each of the embodiments described above has been described taking the liquid crystal display device as an example. However, the application of the present invention is not limited to the liquid crystal display device, and the present invention is also applicable to, for example, an organic EL display device.

Figure 18:
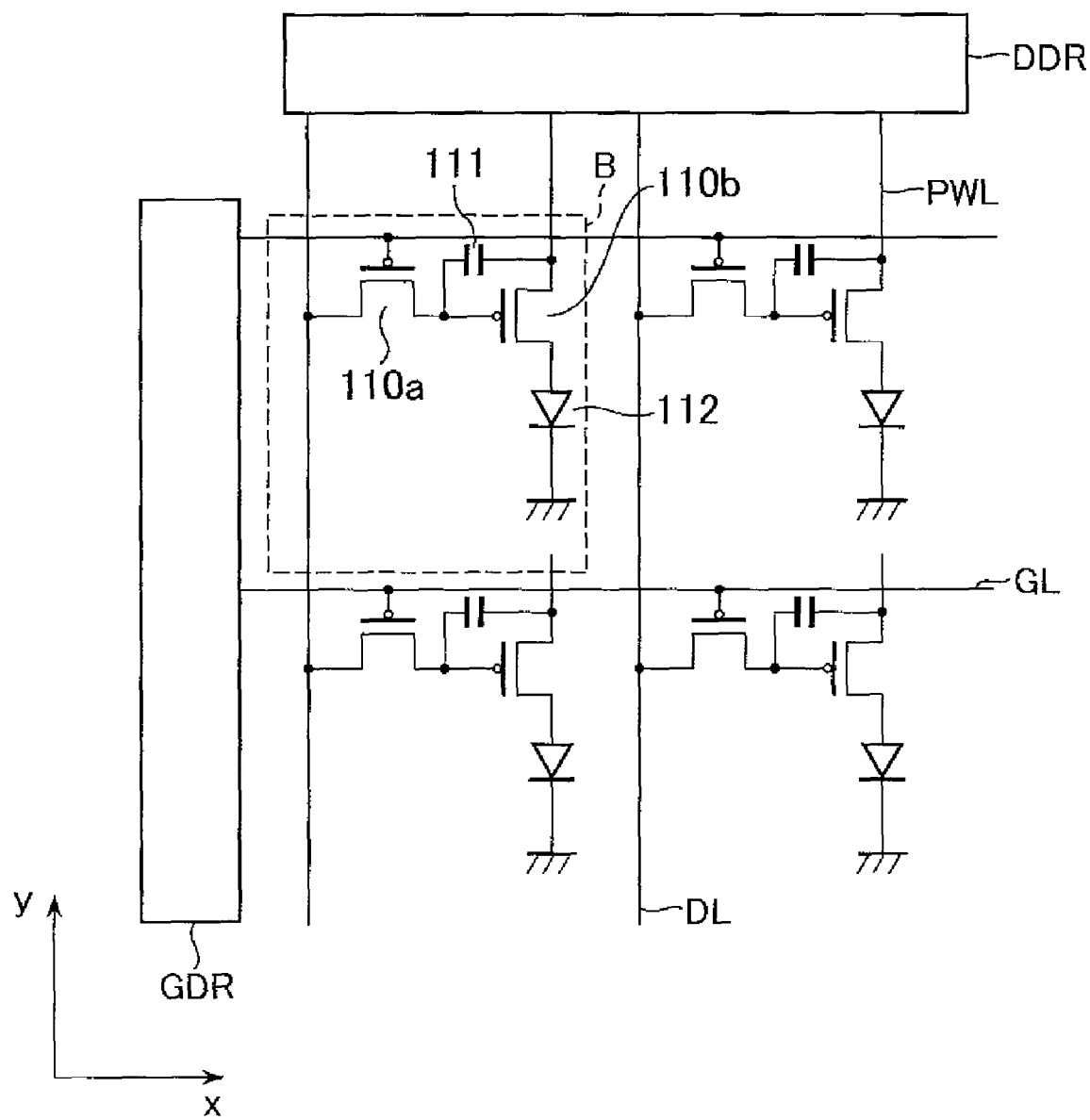
FIG. 18 is a diagram illustrating an equivalent circuit in a display area of an organic EL display device.

FIG. 18 is a diagram illustrating an equivalent circuit in a display area of the organic EL display device. In FIG. 18, the gate signal lines GL, each extending in the x-direction of FIG. 18, are formed to be arranged in parallel in the y-direction of FIG. 18. One end of each of the gate signal lines GL is connected to the gate driver GDR so that the scanning signals are sequentially fed to the gate signal lines GL. Power feed lines PWL, each extending in the y-direction of FIG. 18, are formed to be arranged in parallel in the x-direction of FIG. 18. Further, the drain signal lines DL, each extending in the y-direction of FIG. 18, are formed to be arranged in parallel in the x-direction of FIG. 18. One end of each of the drain signal lines DL is connected to the drain driver DDR so that the video signals are fed to the drain signal lines DL.

A pixel area corresponds to an area surrounded by a dot-line frame B illustrated in FIG. 18. The display area is constituted by a set of a plurality of the pixels arranged in a shape of matrix. In the pixel area, a switching element 110a, an auxiliary capacitor 111, a current control element 110b, and an organic EL element 112 are formed. The scanning signal is fed from the gate signal line GL to turn the switching element 110a ON. Then, electric charges are accumulated in the auxiliary capacitor 111 to control a current flowing through the current control element 110b. Then, the current flows through the power feed line PWL, the organic EL element 112, and the current control element 110b. The organic EL element 112 emits light at a brightness corresponding to a value of the current.

Figure 19:
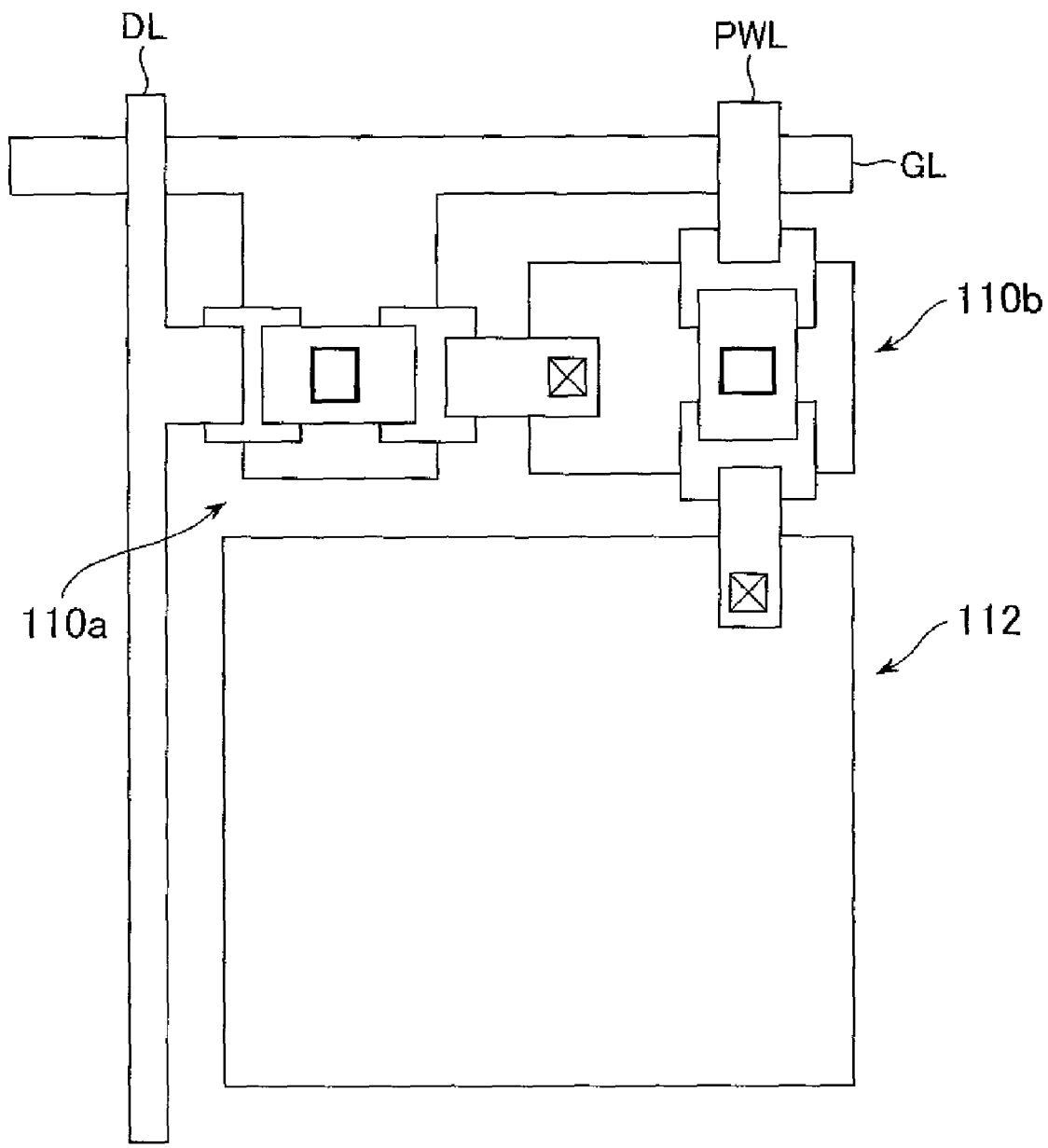
FIG. 19 is a plan view illustrating a structure of an example of a pixel formed on a substrate of the organic EL display device.

FIG. 19 is a plan view illustrating a structure of the pixel formed on the substrate. Each of the switching element 110a and the current control element 110b illustrated in FIG. 18 is formed by the thin-film transistor and has the same structure as that of the thin-film transistor TFTp formed in the pixel of the liquid crystal display device (see FIG. 3).

Although not illustrated, each of the thin-film transistors formed in the gate driver GDR has the similar structure as that of each of the thin-film transistors TFTc described in each of the embodiments described above.

Although the organic EL element 112 is illustrated in a simplified manner in FIG. 19, the organic EL element 112 includes a laminate of an organic EL layer and an electrode (cathode), which is formed on a surface of an electrode (anode) connected to the current control element 110b. In this case, at least one of the electrodes is formed of a transparent conductive film. This is for radiating light emitted from the organic EL layer through the transparent conductive film.

Figure 20:
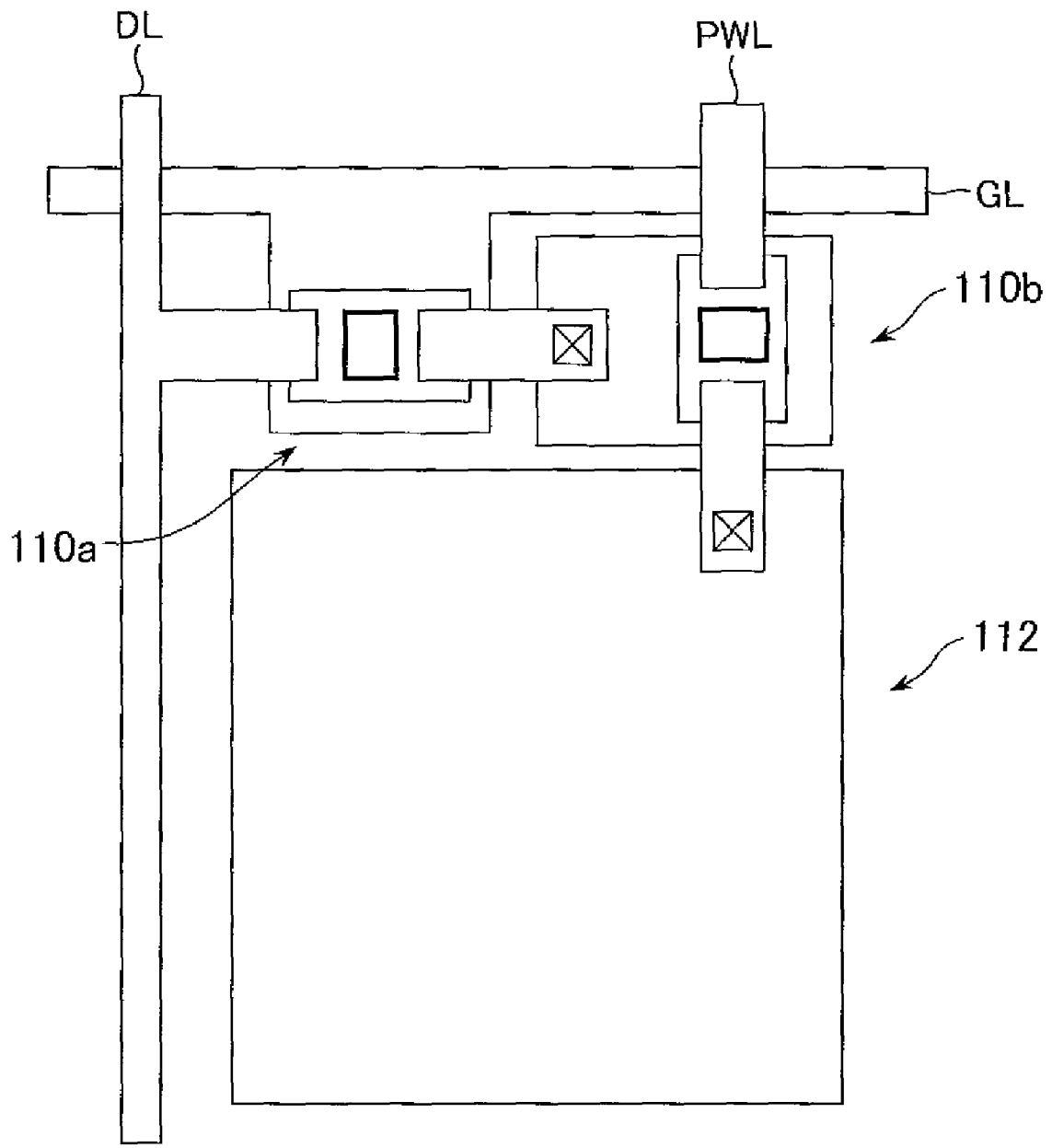
FIG. 20 is a plan view illustrating a structure of another example of the pixel formed on the substrate of the organic EL display device.

FIG. 20 illustrates another example of the structure of the pixel. The structure illustrated in FIG. 20 differs from that illustrated in FIG. 19 in that the thin-film transistor TFT has the same structure as the thin-film transistor TFT illustrated in FIG. 11.

Figure 21:
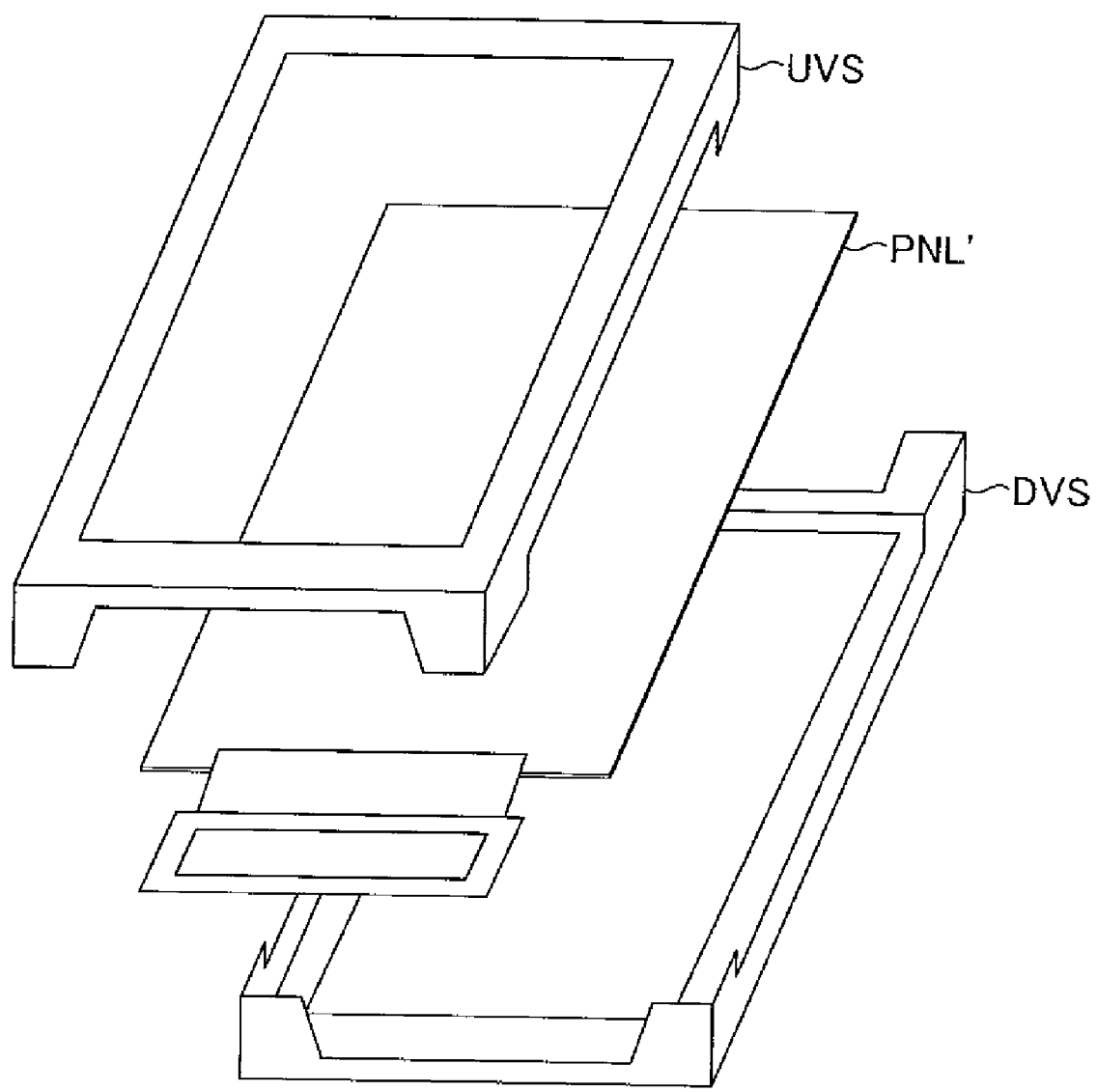
FIG. 21 is an exploded perspective view of an example of an organic EL display device provided with an organic EL display panel to which the present invention is applied.

FIG. 21 is an exploded perspective view of an example of an organic EL display device provided with an organic EL display panel PNL' to which the present invention is applied. The organic EL display device is formed as a module in which the organic EL display panel PNL' is sandwiched between the upper bezel UVS and the lower bezel DVS. The organic EL display panel PNL' can display an image with light emitted by the organic EL elements, and therefore is not provided with a backlight like the liquid crystal display device.

Figure 22:
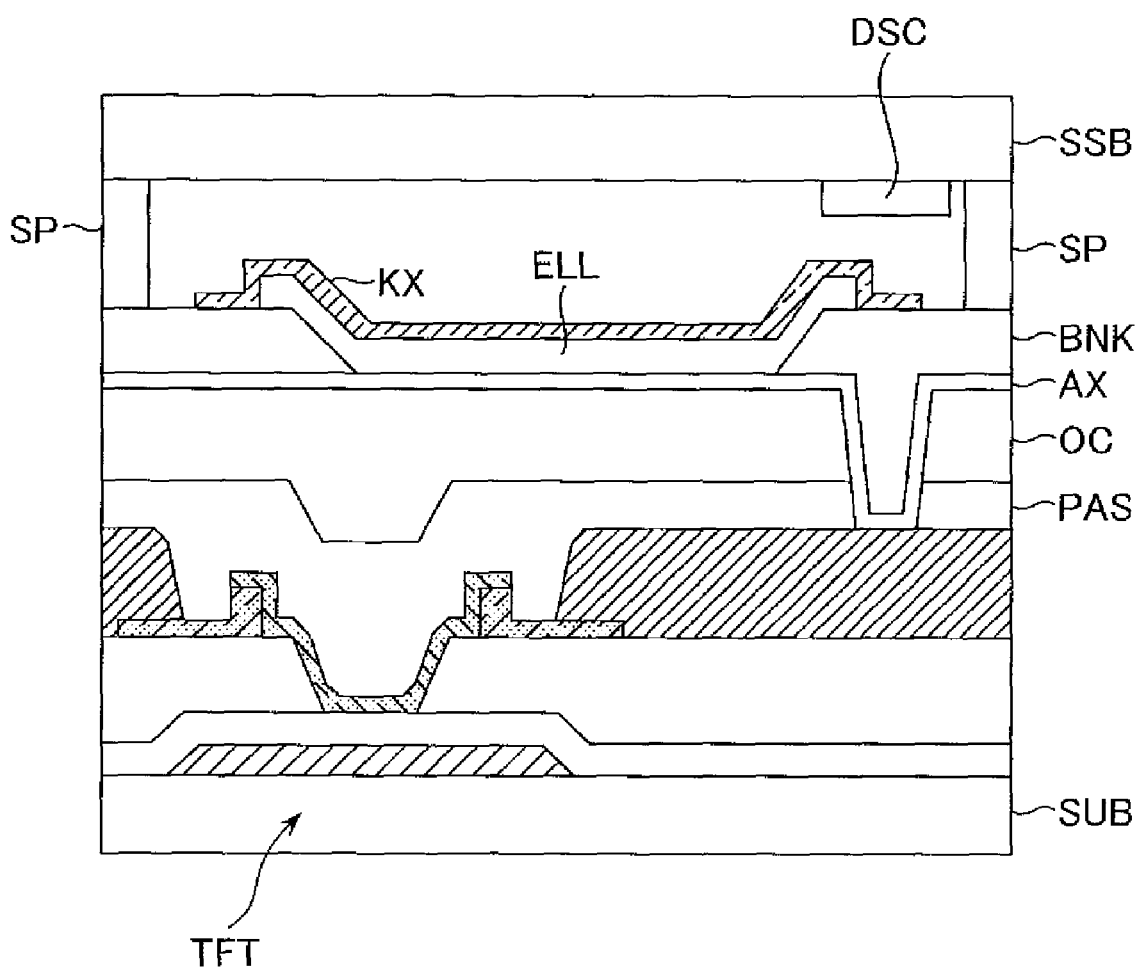
FIG. 22 is a cross-sectional view of the organic EL display panel taken at a portion where a thin-film transistor is formed.

FIG. 22 is a cross-sectional view of the organic EL display panel taken at a portion where the thin-film transistor TFT is formed. As illustrated in FIG. 22, on a main surface of the substrate SUB, the thin-film transistor TFT configured as illustrated in, for example, FIGS. 1A and 1B is formed, and an anode electrode AX connected commonly to each pixel is formed via the protective insulating film PAS and the planarization film OC. A bank insulating film BNK provided with an opening OP is formed on the anode electrode AX. An organic EL film ELL is formed to cover the opening OP and to reach a periphery of the opening OP. A cathode electrode KX is formed on an upper surface of the organic EL film. As a result, the organic EL film ELL is interposed between the anode electrode AX and the cathode electrode KX. A sealing substrate SSB is arranged to be opposed to a surface of the thus configured substrate SUB on which the organic EL film ELL is formed via a spacer SP. Then, a desiccant DSC is formed on a surface of the sealing substrate SSB on the side of the organic EL film ELL to prevent deterioration in the characteristics of the organic EL film ELL due to humidity. The organic EL film ELL emits light when a current flows through the anode electrode AX and the cathode electrode KX. The light is emitted to the outside through, for example, the sealing substrate SSB. In this case, the cathode electrode KX is formed of a transparent conductive film.

While the thin-film transistor TFT illustrated in FIG. 22 has the same structure as that illustrated in FIGS. 1A and 1B, the thin-film transistor TFT may have the same structure as that illustrated in any of the other embodiments.

Eighth Embodiment

Figure 23:
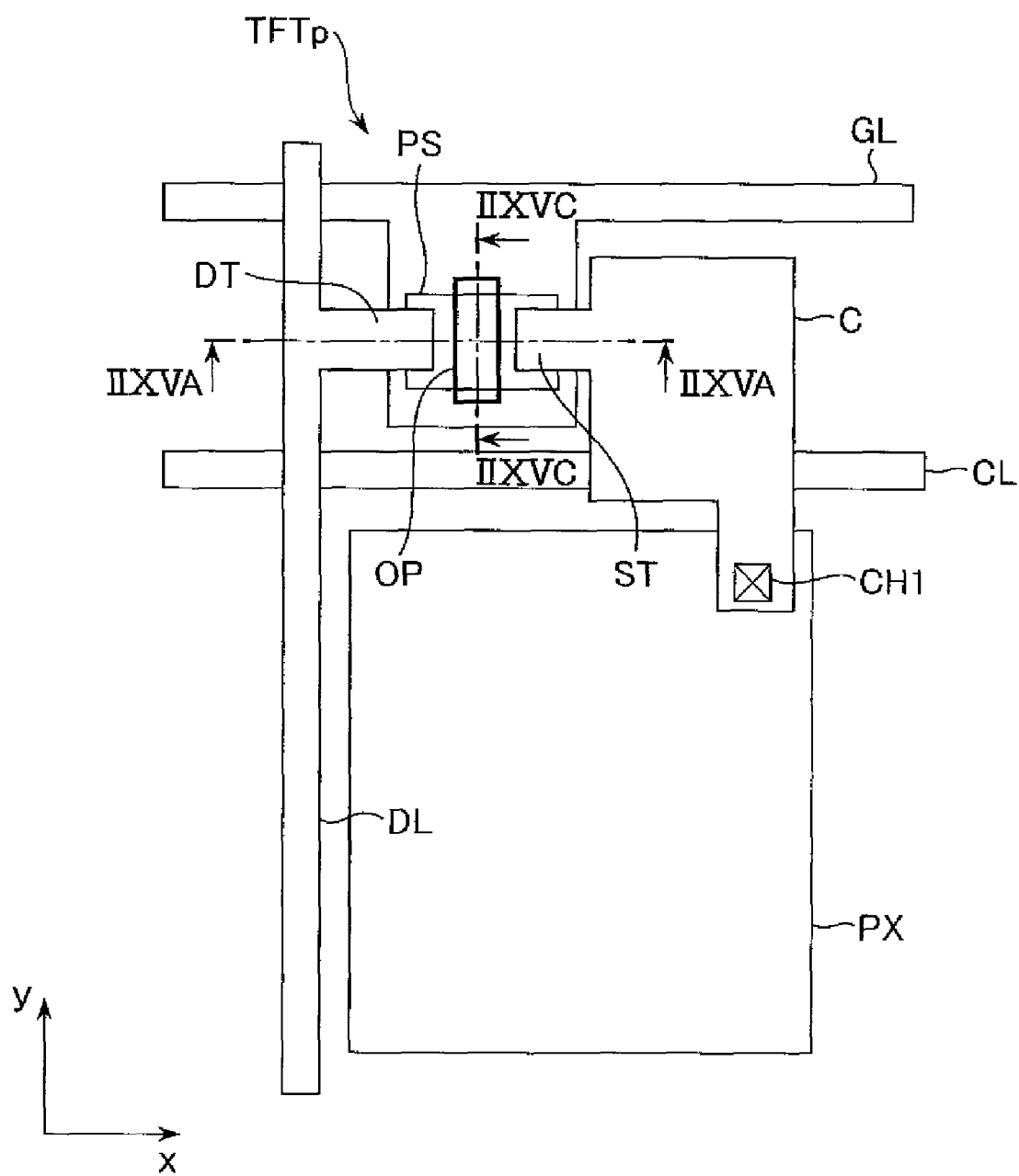
FIG. 23 is a plan view of a pixel illustrating an eighth embodiment of a display device according to the present invention.

FIG. 23 illustrates the structure of an eighth embodiment of, for example, the display device according to the present invention, illustrating the structure in the pixel of the liquid crystal display device. FIG. 23 corresponds to, for example, FIG. 11 in the third embodiment.

In FIG. 23, the structure that is different from that in FIG. 11 is the opening OP formed in the interlayer insulating film IN in the area where the thin-film transistor TFTp is formed. That is, the opening OP has a larger width than a width (width in the same direction as the channel width) of the polycrystalline semiconductor film PS formed across the opening OP, so as to form a pattern in which the opening OP protrudes from both sides of the polycrystalline semiconductor film PS in plan view. In other words, the opening OP of the interlayer insulating film IN is formed to be exposed from each side of the polycrystalline semiconductor film PS in the channel length direction in plan view.

Figure 24:
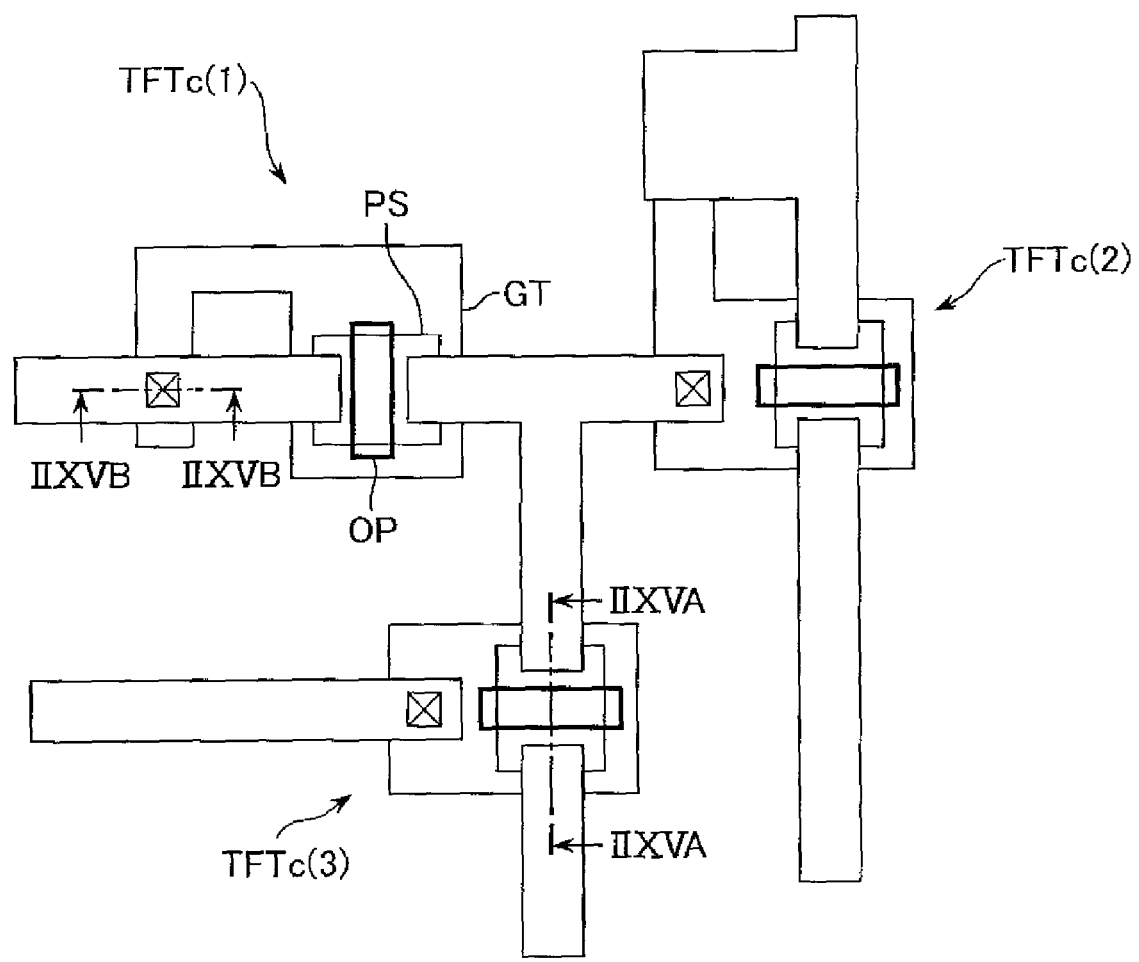
FIG. 24 is a plan view of a bootstrap circuit illustrating the eighth embodiment of the display device according to the present invention.

Likewise, as illustrated in FIG. 24, in each of the thin-film transistors TFTc (1), TFTc (2), and TFTc (3) constituting the gate driver GDR (bootstrap circuit), the opening OP formed in the interlayer insulating film IN is formed to be exposed from each side of the polycrystalline semiconductor film PS in the channel length direction as described above.

Figures 25A, 25B, 25C:
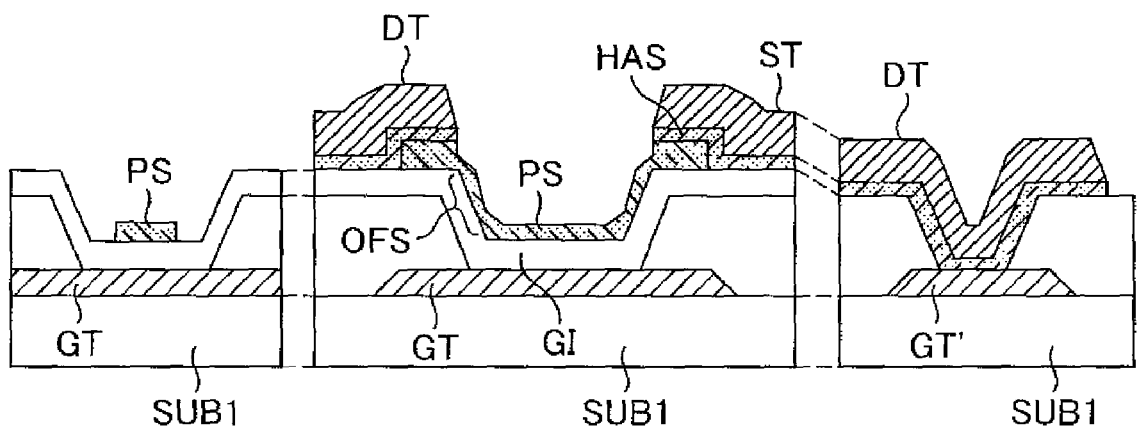
FIG. 25A is a cross-sectional view illustrating a thin-film transistor of the eighth embodiment of the display device according to the present invention.
FIG. 25B is a cross-sectional view illustrating a thin-film transistor of the eighth embodiment of the display device according to the present invention.
FIG. 25C is a cross-sectional view illustrating a thin-film transistor of the eighth embodiment of the display device according to the present invention.

A cross section taken along a line IIXVA-IIXVA of FIG. 23 and a cross section taken along a line IIXVA-IIXVA of FIG. 24 are illustrated in FIG. 25A. A cross section taken along a line IIXVB-IIXVB of FIG. 24 is illustrated in FIG. 25B. A cross section taken along a line IIXVC-IIXVC in FIG. 23 is illustrated in FIG. 25C. FIG. 25C clearly indicates that the opening OP formed in the interlayer insulating film IN is formed to have a larger width than the width (width in the same direction as the channel width) of the polycrystalline semiconductor film PS which is formed across the opening OP.

In the thus configured thin-film transistor TFT, the controllability of the carrier within the channel by the gate electrode GT can be improved in the entire area of the polycrystalline semiconductor film PS in the channel width direction. Therefore, an off current can further be reduced.

In FIG. 23, the insulating film GI is formed over the interlayer insulating film IN. However, the insulating film GI may be formed under the interlayer insulating film TN as illustrated in, for example, FIGS. 1A and 1B in the first embodiment to obtain the same effect.

(Manufacturing Method)

FIGS. 26A to 26D illustrate an example of the method of manufacturing the thin-film transistor TFT described above, each illustrating each of a series of steps. Hereinafter, the manufacturing process is described in order of steps. Each of the views of FIGS. 26A to 26D corresponds to that of FIGS. 25A to 25C.

Figure 26A:
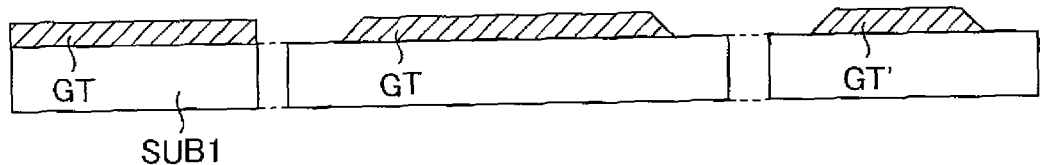
FIG. 26A is a view illustrating a step of a manufacturing method of the eighth embodiment for the display device according to the present invention.

Step 1 (FIG. 26A)

The substrate SUB1 made of, for example, glass is prepared. A metal film (with a thickness of about 150 nm) made of, for example, aluminum is formed on the surface of the substrate SUB1, and subjected to selective etching according to a photolithography technique, to thereby form the gate electrode GT, GT'.

Figure 26B:
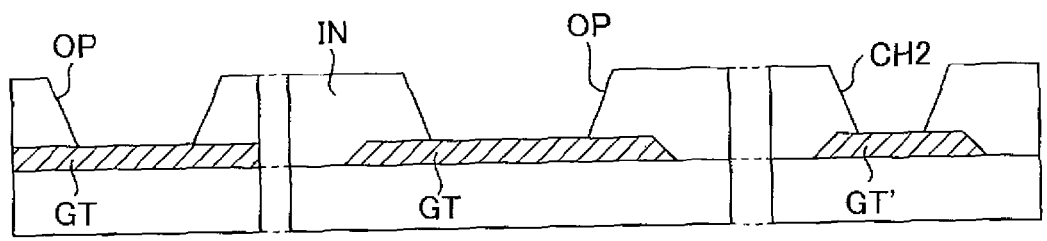
FIG. 26B is a view illustrating a step of the manufacturing method of the eighth embodiment for the display device according to the present invention.

Step 2 (FIG. 26B)

The interlayer insulating film IN made of, for example, a silicon oxide film (with a thickness of about 500 nm) is formed on the surface of the substrate SUB1 so as to cover the gate electrode GT, GT'. Next, the interlayer insulating film IN is formed with an opening at a portion equivalent to the channel area of the thin-film transistor TFT and with an opening at a portion equivalent to the area where the gate electrode GT' and the drain electrode DT of the thin-film transistor TFT are to be connected.

The opening OP formed in an area equivalent to the channel area of the thin-film transistor TFT is formed to have a larger width than the width (width in the direction of the channel width) of the polycrystalline semiconductor film PS formed in a subsequent step. The opening at the portion equivalent to the area where the gate electrode GT' and the drain electrode DT of the thin-film transistor TFT are to be connected serves as the contact hole CH2.

Figure 26C:
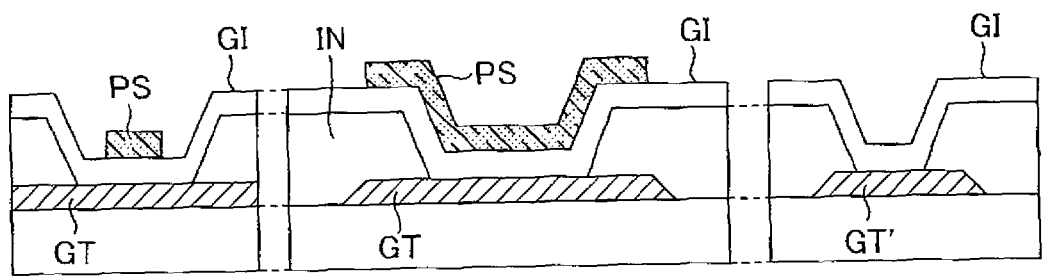
FIG. 26C is a view illustrating a step of the manufacturing method of the eighth embodiment for the display device according to the present invention.

Step 3 (FIG. 26C)

The gate insulating film GI made of a silicon oxide film (100 nm) and the amorphous semiconductor film AS made of an amorphous silicon film (100 nm) are sequentially formed on a surface of the interlayer insulating film IN using, for example, the CVD method to cover the openings. Then, the amorphous semiconductor film AS is crystallized by, for example, laser annealing to form the polycrystalline semiconductor film PS.

Then, the polycrystalline semiconductor film PS is subjected to selective etching according to the photolithography technique such that the polycrystalline semiconductor film PS remains in the area where the thin-film transistor is to be formed and is processed to have an island shape. It is preferred that the etching in this step be performed by, for example, dry etching.

Figure 26D:
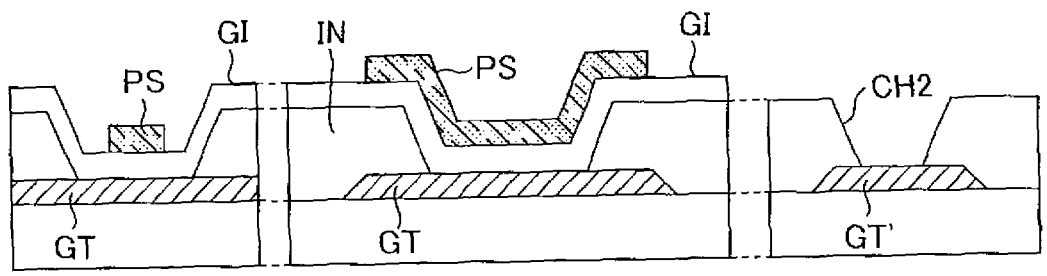
FIG. 26D is a view illustrating a step of the manufacturing method of the eighth embodiment for the display device according to the present invention.

Step 4 (FIG. 26D)

The gate insulating film at a portion equivalent to the area where the gate electrode GT' and the drain electrode DT of the thin-film transistor TFT are to be connected is removed by selective etching according to the photolithography technique to expose the gate electrode GT' through the contact hole CH2.

After that, as illustrated in FIGS. 25A to 25C, a laminated film obtained by sequentially laminating the heavily-doped amorphous semiconductor film HAS made of heavily-doped amorphous silicon (with a thickness of about 25 nm) and the metal film MTL made of, for example, aluminum (with a thickness of about 500 nm) is formed, and subjected to selective etching according to the photolithography technique, to thereby form the drain electrode DT and the source electrode ST. As a result, each of the drain electrode DT and the source electrode ST is formed of a laminated film obtained by sequentially laminating the heavily-doped amorphous semiconductor film HAS and the metal film MTL in the same pattern. Each of the drain electrode DT and the source electrode ST is formed on the interlayer insulating film IN such that a part of each of the drain electrode DT and the source electrode ST overlaps a portion of the polycrystalline semiconductor film PS that is formed on the upper surface of the interlayer insulating film IN (peripheral portion of the polycrystalline semiconductor film PS). The drain electrode DT is electrically connected to the gate electrode GT' of the thin-film transistor TFT through the contact hole CH2. In the formation of the drain electrode DT and the source electrode ST by etching, the surface of the polycrystalline semiconductor film PS is slightly etched as well.

The above-mentioned structure of the thin-film transistor TFT is also applicable to the thin-film transistor TFT in which the polycrystalline semiconductor film PS and each of the drain electrode DT and the source electrode ST are electrically connected via the heavily-doped amorphous semiconductor film HAS arranged therebetween in plan view as illustrated in, for example, FIGS. 1A and 1B or FIG. 8. Further, the above-mentioned structure is also applicable to the thin-film transistor TFT in which the semiconductor film is formed of a laminate of the polycrystalline semiconductor film PS and the amorphous semiconductor film AS as illustrated in FIG. 14. Further, the above-mentioned structure is also applicable to the thin-film transistor TFT in which the inorganic insulating film INR is formed on the upper surface of the polycrystalline semiconductor film PS as illustrated in FIG. 15. Further, the above-mentioned structure is not limited to the application to the thin-film transistor TFT of the liquid crystal display device, and is also applicable to the thin-film transistor TFT of, for example, the organic EL display device.

Ninth Embodiment

Figures 27A, 27B, 27C:
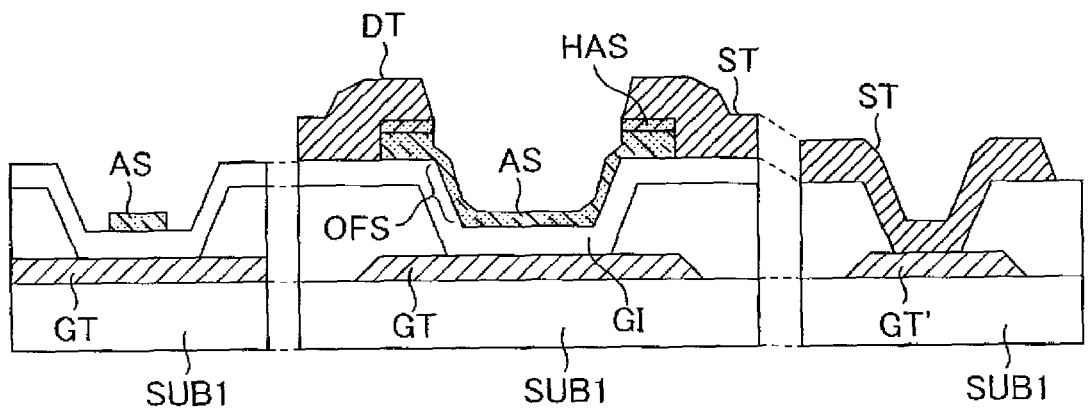
FIG. 27A is a cross-sectional view illustrating a thin-film transistor of a ninth embodiment of a display device according to the present invention.
FIG. 27B is a cross-sectional view illustrating a thin-film transistor of the ninth embodiment of the display device according to the present invention.
FIG. 27C is a cross-sectional view illustrating a thin-film transistor of the ninth embodiment of the display device according to the present invention.

FIGS. 27A to 27C are cross-sectional views of a thin-film transistor TFT provided in a display device according to a ninth embodiment of the present invention.

FIGS. 27A to 27C correspond to FIGS. 25A to 25C. The structure illustrated in FIGS. 27A to 27C differs from that illustrated in FIGS. 25A to 25C in that the channel layer is formed of the amorphous semiconductor film AS and in that the heavily-doped amorphous semiconductor film HAS is formed only on a top of the amorphous semiconductor film AS. Thus, the plan view of the pixel is similar to FIG. 23 but different in that the amorphous semiconductor film AS is substituted for the polycrystalline semiconductor film PS.

In the thus configured thin-film transistor TFT, the gate insulating film GI, the amorphous semiconductor film AS, and the heavily-doped amorphous semiconductor film HAS can be continuously formed, to thereby reduce the number of manufacturing processes. Further, in the thus configured thin-film transistor TFT, the interlayer insulating film with a relatively large thickness is formed between the gate electrode GT and the drain electrode DT, and between the gate electrode GT and the source electrode ST. Therefore, the parasitic capacitance at the intersection between the gate signal line GL and the drain signal line DL can be reduced. In addition, the gate insulating film may be made as thin as, for example, about 100 nm, which improves the performance of the thin-film transistor and realizes high-speed operation of the thin-film transistor.

In this embodiment, the amorphous semiconductor film AS is configured to directly contact the drain electrode DT and the source electrode ST at side surface portions of the amorphous semiconductor film AS. However, the contact area with the drain electrode DT and the source electrode ST is about as thick as the amorphous semiconductor film AS (about 200 nm), which is sufficiently small compared to the contact area with the heavily-doped amorphous semiconductor film HAS (1 μm or more). In addition, the interlayer insulating film (about 500 nm) is formed between the gate electrode GT and the amorphous semiconductor film AS, and the side surface portions of the amorphous semiconductor film AS and the gate electrode GT is formed to have a sufficient gap therebetween. Therefore, an off-leak current is not increased so that the display quality is not reduced. As a possible method of increasing the gap between the side surface portions of the amorphous semiconductor film AS and the gate electrode GT, it is conceivable to form the amorphous semiconductor film AS so as to protrude from the area where the gate electrode GT is to be formed. In this method, however, the amorphous semiconductor film AS is irradiated with light from the backlight to increase an off current. Thus, the present invention can effectively reduce both an off-leak current and an off current during the irradiation of light in the structure in which each of the drain electrode DT and the source electrode ST contacts the side surface portion of the amorphous semiconductor film AS.

(Manufacturing Method)

FIGS. 28A to 28D illustrate an example of the method of manufacturing the thin-film transistor TFT described above, each illustrating each of a series of steps. Hereinafter, the manufacturing process is described in order of steps. Each of the views of FIGS. 28A to 28D corresponds to that of FIGS. 27A to 27C.

Figure 28A:
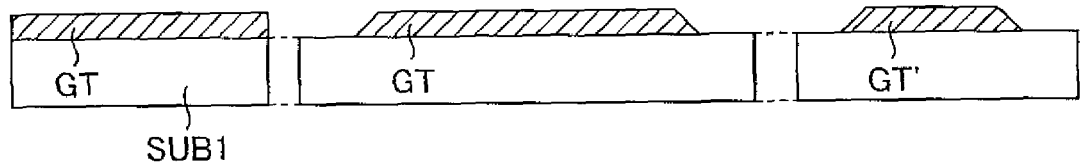
FIG. 28A is a view illustrating a step of a manufacturing method of the ninth embodiment for the display device according to the present invention.

Step 1 (FIG. 28A)

The substrate SUB1 made of, for example, glass is prepared. A metal film (with a thickness of about 150 nm) made of, for example, aluminum is formed on a surface of the substrate SUB1, and subjected to selective etching according to a photolithography technique, to thereby form the gate electrode GT, GT'.

Figure 28B:
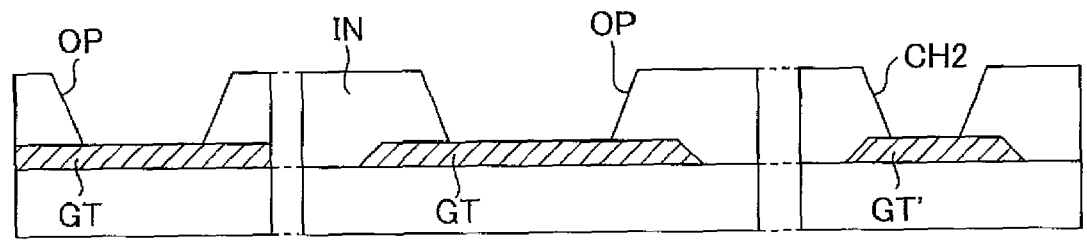
FIG. 28B is a view illustrating a step of the manufacturing method of the ninth embodiment for the display device according to the present invention.

Step 2 (FIG. 28B)

The interlayer insulating film IN made of, for example, a silicon nitride film (with a thickness of about 500 nm) is formed on the surface of the substrate SUB1 so as to cover the gate electrode GT, GT'. Next, the interlayer insulating film IN is formed with an opening at a portion equivalent to the channel area of the thin-film transistor TFT and with an opening at a portion equivalent to the area where the gate electrode GT' and the source electrode ST of the thin-film transistor TFT are to be connected.

The opening OP formed in an area equivalent to the channel area of the thin-film transistor TFT is formed to have a larger width than the width (width in the direction of the channel width) of the amorphous semiconductor film AS formed in a subsequent step. The opening at the portion equivalent to the area where the gate electrode GT' and the source electrode ST of the thin-film transistor TFT are to be connected serves as the contact hole CH2.

Figure 28C:
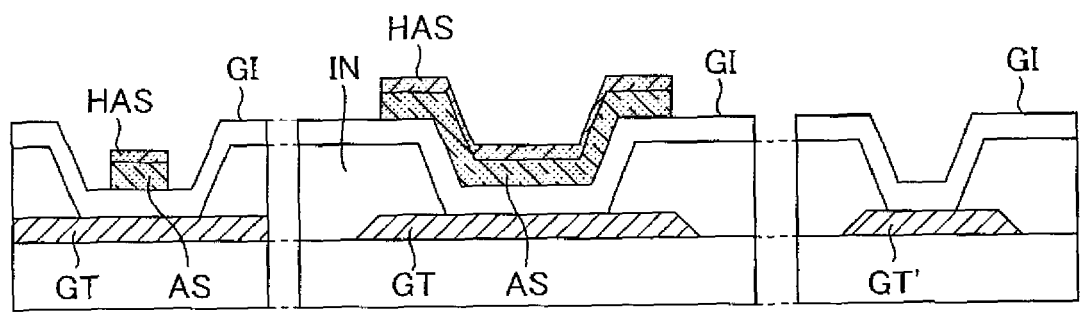
FIG. 28C is a view illustrating a step of the manufacturing method of the ninth embodiment for the display device according to the present invention.

Step 3 (FIG. 28C)

The gate insulating film GI made of a silicon nitride film (with a thickness of about 100 nm), the amorphous semiconductor film AS made of amorphous silicon (with a thickness of about 200 nm), and the highly-doped amorphous semiconductor film HAS made of highly-doped amorphous silicon (with a thickness of about 25 nm) are sequentially formed on a surface of the interlayer insulating film IN using, for example, the CVD method to cover the openings.

Then, the amorphous semiconductor film AS and the highly-doped amorphous semiconductor film HAS are subjected to selective etching according to the photolithography technique such that the amorphous semiconductor film AS and the highly-doped amorphous semiconductor film HAS remain in the area where the thin-film transistor is to be formed and are processed to have an island shape. It is preferred that the etching in this step be performed by, for example, dry etching. It is also preferred that the side surface portion of the amorphous semiconductor film AS be oxidized by, for example, a plasma oxidation process with the resist remaining.

Figure 28D:
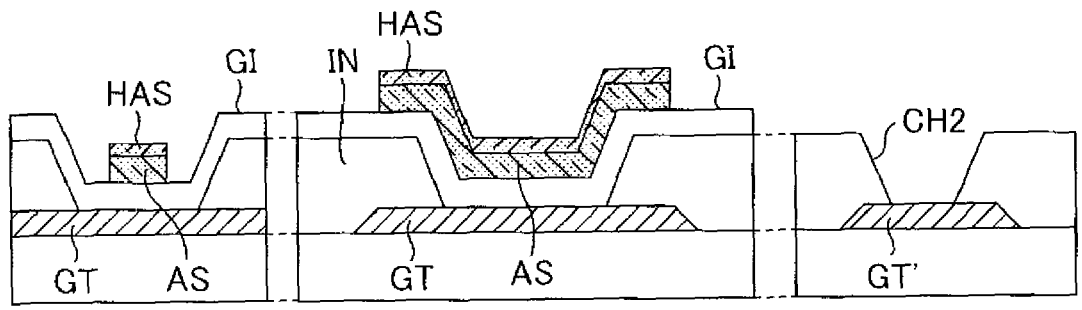
FIG. 28D is a view illustrating a step of the manufacturing method of the ninth embodiment for the display device according to the present invention.

Step 4 (FIG. 28D)

The gate insulating film at a portion equivalent to the area where the gate electrode GT' and the source electrode ST of the thin-film transistor TFT are to be connected is removed by selective etching according to the photolithography technique to expose the gate electrode GT' through the contact hole CH2.

Thereafter, as illustrated in FIGS. 27A to 27C, the metal film MTL made of, for example, aluminum (with a thickness of about 500 nm) is formed, and subjected to selective etching according to the photolithography technique to form the drain electrode DT and the source electrode ST. Further, the heavily-doped amorphous semiconductor film HAS is removed by etching using the drain electrode DT and the source electrode ST as masks. Each of the drain electrode DT and the source electrode ST is formed on the interlayer insulating film IN such that a part of each of the drain electrode DT and the source electrode ST overlaps a portion of the amorphous semiconductor film AS that is formed on the upper surface of the interlayer insulating film IN (a peripheral portion of the amorphous semiconductor film AS). The source electrode ST is electrically connected to the gate electrode GT' of the thin-film transistor TFT through the contact hole CH2. In the formation of the heavily-doped amorphous semiconductor film HAS by etching, a surface of the amorphous semiconductor film AS is slightly etched as well.

The above-mentioned manufacturing method in which the gate insulating film GI, the amorphous semiconductor film AS, and the heavily-doped amorphous semiconductor film HAS are continuously and sequentially formed is also applicable to the structure in which the gate insulating film GI is processed to have the same island shape as the amorphous semiconductor film AS as illustrated in, for example, FIG. 10. In this case, as illustrated in FIGS. 13A to 13D, the processing of the amorphous semiconductor film AS into the island shape and the formation of the contact hole CH2 can be performed in the same process to reduce the number of manufacturing processes. The above-mentioned structure of the thin-film transistor TFT is also applicable to an image display device in which each of the gate driver and the drain driver is formed of an LSI. In this case, the process of forming the contact hole CH2 illustrated in FIG. 28D can be omitted. The above-mentioned structure is not limited to the application to the thin-film transistor TFT of the liquid crystal display device, and is also applicable to the thin-film transistor TFT of, for example, the organic EL display device.

Tenth Embodiment

Figures 29A, 29B, 29C:
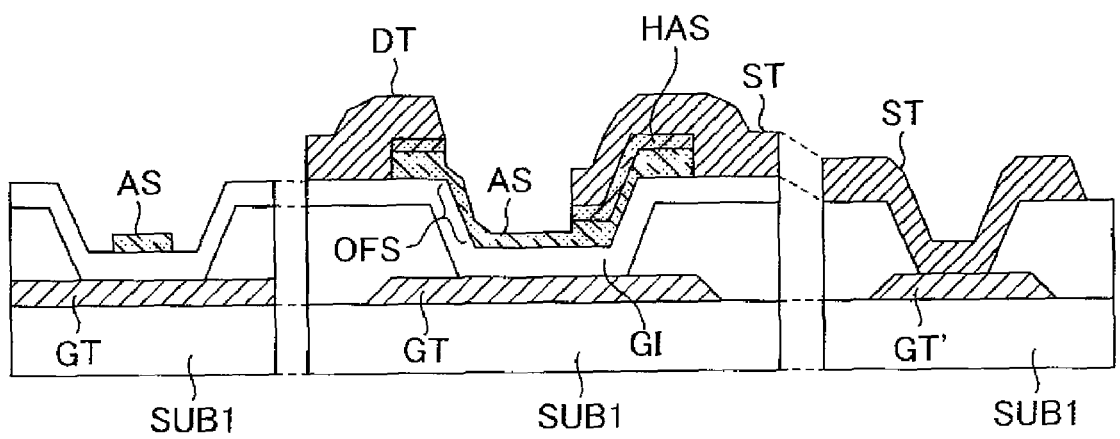
FIG. 29A is a cross-sectional view illustrating a thin-film transistor of a tenth embodiment of a display device according to the present invention.
FIG. 29B is a cross-sectional view illustrating a thin-film transistor of the tenth embodiment of the display device according to the present invention.
FIG. 29C is a cross-sectional view illustrating a thin-film transistor of the tenth embodiment of the display device according to the present invention.

FIGS. 29A to 29C are cross-sectional views of a thin-film transistor TFT provided in a display device according to a tenth embodiment of the present invention.

FIGS. 29A to 29C correspond to FIGS. 27A to 27C. The structure illustrated in FIGS. 29A to 29C differs from that illustrated in FIGS. 27A to 27C in that the source electrode ST is also formed inside the opening OP of the interlayer insulating film.

Also, in the structure described above, the contact area between the side surface portion of the amorphous semiconductor film AS and the source electrode ST is on the upper surface of the interlayer insulating film IN, and sufficiently spaced from the gate electrode GT. Therefore, an off-leak current is not increased. Further, the amorphous semiconductor film AS is formed without protruding from the gate electrode GT. Therefore, an off current is not increased by the irradiation of light from the backlight. In this embodiment, the distance between the drain electrode DT and the source electrode ST, namely the channel length, can be reduced to realize circuit integration.

The same effect can be obtained also in the case where the drain electrode DT is formed inside the opening OP of the interlayer insulating film. However, in the thin-film transistor TFTp in the pixel area, in particular, it is preferred that one of the electrodes that is connected to the capacitor C be formed inside the opening OP of the interlayer insulating film. The capacitor between the electrode connected to the drain signal line DL and the gate electrode GT serves as the parasitic capacitance between the drain signal line DL and the gate signal line GL. Therefore, the parasitic capacitance between the drain signal line DL and the gate signal line GL can be reduced to a greater degree in the above-mentioned structure to realize high-speed driving of the liquid crystal. Alternatively, both the drain electrode DT and the source electrode ST may be formed inside the opening OP of the interlayer insulating film. In this case, the performance of the thin-film transistor can be further improved to enable high-speed driving of the liquid crystal and increased circuit integration.

Eleventh Embodiment

In each of the embodiments described above, for example, glass is used as a material of the substrate. However, the material of the substrate is not limited thereto, and quartz glass or a resin may also be used. By using the quartz glass for the substrate, a process temperature can be increased to, for example, densify the gate insulating film. As a result, the reliability of characteristics of the thin-film transistor can be improved. Moreover, by using the resin for the substrate, the light-weight liquid crystal display device excellent in impact resistance can be obtained.

Twelfth Embodiment

In each of the embodiments described above, the silicon oxide film is formed as the underlayer film formed on the surface of the substrate. However, the underlayer film is not limited thereto. A silicon nitride film or a laminate film of the silicon oxide film and the silicon nitride film may also be used. By using the silicon nitride film for a part of or the entirety of the underlayer film, the impurities in the substrate can be effectively prevented from being diffused into the gate insulating film. For the same reason, the gate insulating film may be formed of a laminate film of, for example, the silicon oxide film and the silicon nitride film.

Thirteenth Embodiment

In the embodiments described above, the amorphous silicon is crystallized by the laser annealing. However, the method of crystallizing the amorphous silicon is not limited thereto. A solid-phase growth method with thermal annealing may be used, or the combination of the thermal annealing and the laser annealing may be performed. Moreover, a method of directly forming a polysilicon film by using reactive thermal CVD may be used without crystallizing the amorphous silicon. In this case, the reduction of the number of crystallization steps leads to improve a throughput. For the polysilicon layer, microcrystalline silicon having a particle diameter of about 20 nm to 100 nm may be used. Moreover, a compound of silicon and germanium may also be used. In this case, the performance of the thin-film transistor TFT can be improved.

Fourteenth Embodiment

In the ninth and tenth embodiments described above, the amorphous silicon film and the heavily-doped amorphous silicon film may be respectively replaced with a polysilicon film and a heavily-doped polysilicon film. Among polysilicons, microcrystalline silicon having a particle diameter of about 20 nm to 100 nm may be used. In this case, not only the resistance of the channel layer but also the contact resistance between the channel layer and each of the source electrode and the drain electrode can be reduced so as to improve the performance of the thin-film transistor TFT.

Fifteenth Embodiment

Although a material of each of the gate signal line and the gate electrode has not been specifically described in the embodiments described above, for example, a metal such as Ti, TiW, TiN, W, Cr, Mo, Ta, Nb, or an alloy thereof may be used.

While the embodiments of the present invention have been described above, the structures described in the embodiments are merely examples, and modifications may be appropriately made to the invention without departing from the technical idea thereof. Further, the structures described in the respective embodiments may be used in combination as long as the structures are consistent.

What is claimed is:

1. A display device comprising a plurality of thin-film transistors formed on a substrate on which a display area is formed,
wherein at least one of the plurality of thin-film transistors comprising:
a gate electrode;
an interlayer insulating film formed on the gate electrode and having an opening formed in an area where the gate electrode is formed in plan view;
a gate insulating film formed to cover the interlayer insulating film;
an island-like laminate formed by sequentially laminating a semiconductor film and a heavily-doped semiconductor film, wherein the island-like laminate is formed so as to be across the opening of the interlayer insulating film and is formed in the area where the gate electrode is formed in plan view; and
a pair of electrodes arranged on an upper surface of the interlayer insulating film with the opening interposed therebetween,
wherein each of the pair of electrodes is formed to partly overlap the heavily-doped semiconductor film and to partly overlap the gate electrode such that the interlayer insulating film is interposed between a part of each of the pair of electrodes and the gate electrode, when viewed in the plan view, and wherein a thickness of the interlayer insulating film is greater than a thickness of the gate insulating film to thereby decrease parasitic capacitance between a gate signal line coupled to the gate electrode and a drain signal line coupled to one of the pair of electrodes.

2. The display device according to claim 1,
wherein in the at least one of the plurality of thin-film transistors, the gate insulating film is processed to have an island shape in the area where the gate electrode is formed, and
wherein one of the pair of electrodes is electrically connected to the gate electrode through a through hole formed in the interlayer insulating film.

3. The display device according to claim 1, wherein the opening of the interlayer insulating film is exposed from each side of the semiconductor film in a channel length direction in plan view.

4. The display device according to claim 1,
wherein at least one of the pair of electrodes is formed inside the opening as well, and
wherein side surface portions of the island-like semiconductor film and the pair of electrodes contact each other on the upper surface of the interlayer insulating film.

5. The display device according to claim 1, wherein the semiconductor film comprises an amorphous semiconductor film.

6. The display device according to claim 5, wherein the heavily doped semiconductor film comprises a heavily doped amorphous semiconductor film.

7. The display device according to claim 1, wherein the heavily doped semiconductor film comprises a heavily doped amorphous semiconductor film.

8. The display device according to claim 1, wherein the semiconductor film includes side surfaces formed in direct contact, respectively, with side surfaces of said pair of electrodes, and wherein the heavily doped semiconductor film is interposed between an upper surface of the semiconductor film and lower surfaces of said pair of electrodes.

9. The display device according to claim 8, wherein the contact area between the side surface of the semiconductor film and the side surfaces of each of the pair of electrodes, respectively, is less than the area of contact between the lower surface of each of the pair of electrodes and an upper surface of the heavily doped semiconductor film, respectively.

10. The display device according to claim 9, wherein a thickness of each of the side surfaces of the semiconductor film contacting, respectively, the side surfaces of the pair of electrodes is about 200 nm.

11. The display device according to claim 1, wherein the interlayer insulating film has a thickness at least three times the thickness of the gate insulating film.

12. The display device according to claim 1, wherein the interlayer insulating film has a thickness at least five times greater than the thickness of the gate insulating film.

13. The display device according to claim 12, wherein the gate insulating film has a thickness of about 100 nm and the interlayer insulating film has a thickness of about 500 nm.

14. The display device according to claim 13, wherein a thickness of each of the side surfaces of the semiconductor film contacting, respectively, the side surfaces of the pair of electrodes is about 200 nm.

* * * * *